(12) United States Patent
Kurokawa

(10) Patent No.: US 8,947,121 B2
(45) Date of Patent: Feb. 3, 2015

(54) PROGRAMMABLE LOGIC DEVICE

(71) Applicant: Semiconductor Energy Laboratory Co., Ltd., Atsugi-Shi, Kanagawa-Ken (JP)

(72) Inventor: Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/198,355

(22) Filed: Mar. 5, 2014

(65) Prior Publication Data

US 2014/0266301 A1    Sep. 18, 2014

(30) Foreign Application Priority Data

Mar. 12, 2013   (JP) .................... 2013-048616

(51) Int. Cl.
 *H03K 19/0175* (2006.01)
 *H03K 19/003* (2006.01)
(52) U.S. Cl.
 CPC ..................... *H03K 19/003* (2013.01)
 USPC .............................................. 326/38; 326/41
(58) Field of Classification Search
 USPC ..................................................... 326/37–41
 See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,127,702 A | 10/2000 | Yamazaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Ki Chul Chun et al.; "A 3T Gain Cell Embedded DRAM Utilizing Preferential Boosting for High Density and Low Power On-Die Caches"; IEEE Journal of Solid-State Circuits, vol. 46, No. 6; pp. 1495-1505; Jun. 1, 2011.

(Continued)

*Primary Examiner* — Don Le
(74) *Attorney, Agent, or Firm* — Fish & Richardson P.C.

(57) ABSTRACT

A programmable logic device that verifies whether configuration data is stored correctly is provided. The programmable logic device includes a configuration memory storing configuration data input to a first wiring and a switch controlling conduction or non-conduction between a second wiring and a third wiring in accordance with the configuration data stored in the configuration memory. Further, whether the configuration data input to the first wiring agrees with configuration data actually stored in the configuration memory is verified by comparing the potential of the second wiring with the configuration data input to the first wiring.

20 Claims, 14 Drawing Sheets

(56) References Cited

U.S. PATENT DOCUMENTS

| | | | |
|---|---|---|---|
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,159,266 | B1 * | 4/2012 | Madurawe ............ 326/41 |
| 2001/0046027 | A1 | 11/2001 | Tai et al. |
| 2002/0001222 | A1 * | 1/2002 | Camarota ............ 365/156 |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0034325 | A1 * | 2/2009 | Lowrey et al. ............ 365/163 |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0148171 | A1 | 6/2010 | Hayashi et al. |
| 2011/0320770 | A1 | 12/2011 | Yamada et al. |
| 2012/0212995 | A1 | 8/2012 | Kurokawa |
| 2013/0207170 | A1 | 8/2013 | Kurokawa |
| 2013/0285697 | A1 | 10/2013 | Kurokawa |
| 2013/0293263 | A1 | 11/2013 | Kurokawa |
| 2013/0314124 | A1 | 11/2013 | Ikeda et al. |
| 2013/0321025 | A1 | 12/2013 | Kurokawa et al. |
| 2014/0225644 | A1 * | 8/2014 | Aoki et al. ............ 326/41 |

FOREIGN PATENT DOCUMENTS

| | | | |
|---|---|---|---|
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2012-008715 | A | 1/2012 |
| WO | WO-2004/114391 | | 12/2004 |

OTHER PUBLICATIONS

Fatemeh Eslami et al.; "Capacitive Boosting for FPGA Interconnection Networks"; 21st International Conference on Field Programmable Logic and Applications, vol. 21; pp. 453-458; 2011.

Shoji Shukuri et al.; "A Complementary Gain Cell Technology for Sub-1V Supply DRAMs"; IEDM 92: Technical Digest of International Electron Devices Meeting; pp. 1006-1008; Dec. 13, 1992.

Wonchan Kim et al.; "An Experimental High-Density DRAM Cell with a Built-in Gain Stage"; IEEE Journal of Solid-State Circuits, vol. 29, No. 8; pp. 978-981; Aug. 1, 1994.

Shoji Shukuri et al.; "A Semi-Static Complementary Gain Cell Technology for Sub-1 V Supply DRAM's"; IEEE Transactions on Electron Devices, vol. 41, No. 6; pp. 926-931; Jun. 1, 1994.

Tomoyuki Ishii et al.; "A Poly-Silicon TFT With a Sub-5-nm Thick Channel for Low-Power Gain Cell Memory in Mobile Applications"; IEEE Transactions on Electron Devices, vol. 51, No. 11; pp. 1805-1810; Nov. 1, 2004.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

(56) References Cited

OTHER PUBLICATIONS

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", Journal of the SID, 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al. "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGS AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

(56) References Cited

OTHER PUBLICATIONS

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

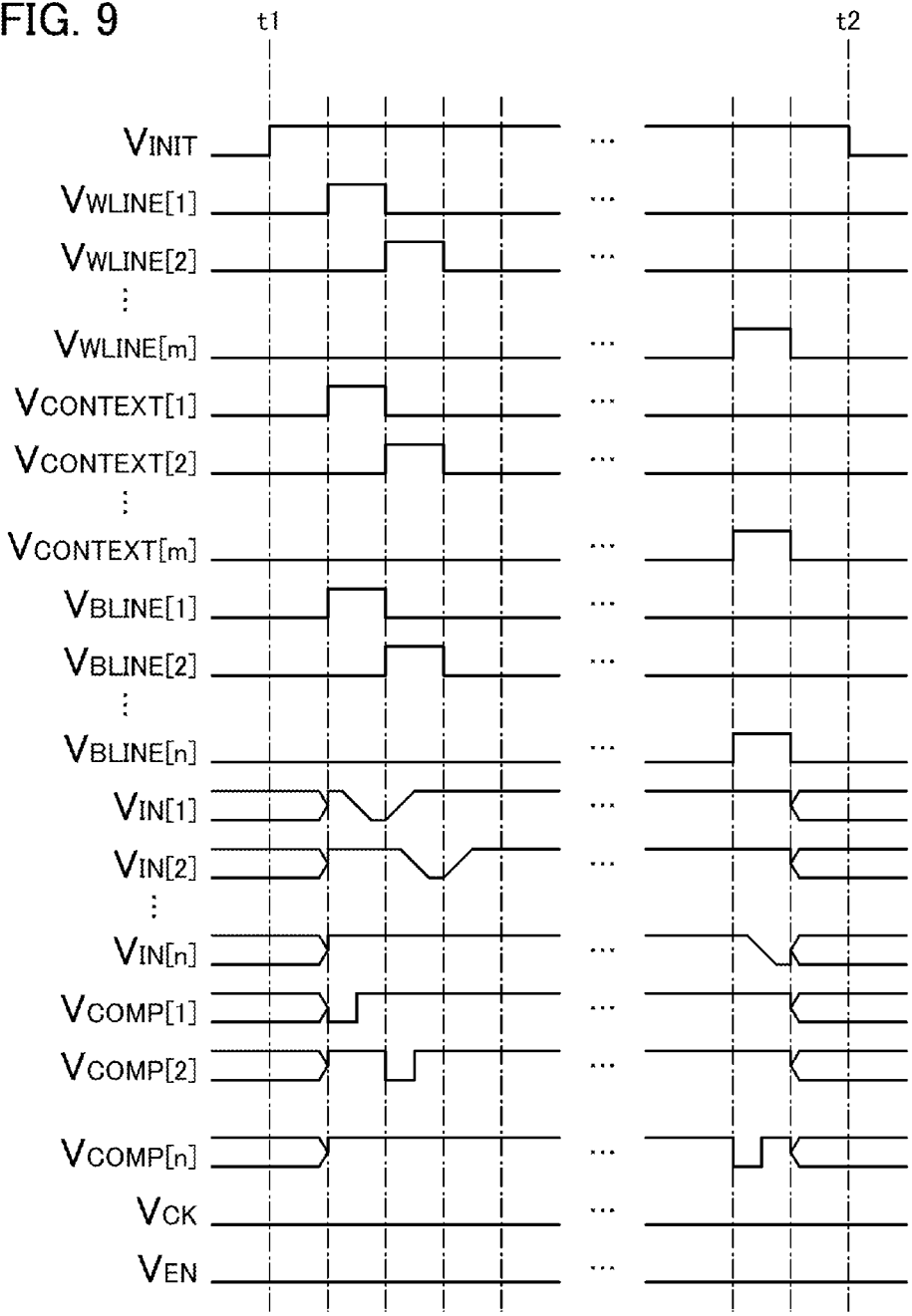

PROGRAMMABLE LOGIC DEVICE

BACKGROUND OF THE INVENTION

1. Field of the Invention

One embodiment of the present invention relates to semiconductor devices and programmable logic devices.

2. Description of the Related Art

Programmable logic devices (PLD) have attracted attention in recent years. The internal logic circuit design of a PLD can be changed by a user after product shipment by controlling the on state or off state of a switch in accordance with configuration data stored in a configuration memory to change connection between logic elements (see Patent Document 1).

REFERENCE

Patent Document 1: Japanese Published Patent Application No. 2012-008715

SUMMARY OF THE INVENTION

In Patent Document 1, whether configuration data is written to the configuration memory correctly and whether the configuration data is retained correctly while a programmable logic device operates are unclear. In view of this, an object of one embodiment of the present invention is to verify whether configuration data is written correctly and whether configuration data is retained correctly. Another object of one embodiment of the present invention is to improve reliability, reduce power consumption, achieve high integration, reduce the number of elements, and/or prevent malfunction, for example. Another object of one embodiment of the present invention is to provide a semiconductor device with a novel structure.

One embodiment of the present invention includes a configuration memory storing configuration data input to a first wiring and a switch controlling conduction or non-conduction between a second wiring and a third wiring in accordance with the configuration data stored in the configuration memory. Further, whether the configuration data input to the first wiring agrees with configuration data actually stored in the configuration memory is verified by comparing the potential of the second wiring with the configuration data input to the first wiring.

In one embodiment of the present invention, while the potential of the second wiring is compared with the configuration data input to the first wiring, a predetermined potential is preferably supplied to the third wiring.

In one embodiment of the present invention, it is preferable not to output an output from a logic element connected to the second wiring to the second wiring.

One embodiment of the present invention includes a memory circuit, a switch, a first circuit, and a second circuit. The memory circuit has a function of storing configuration data input to a first wiring. The switch has a function of controlling conduction or non-conduction between a second wiring and a third wiring in accordance with the configuration data stored in the memory circuit. The second circuit has a function of comparing the potential of the first wiring with the potential of the second wiring to output a signal based on the comparison result of the potential of the first wiring and the potential of the second wiring, or has a function of detecting the potential of the second wiring to output a signal based on the potential of the second wiring.

In one embodiment of the present invention, the memory circuit may include a transistor, and the transistor may include an oxide semiconductor. One of a source and a drain of the transistor is electrically connected to the first wiring, and the other of the source and the drain of the transistor is electrically connected to a control terminal of the switch.

In one embodiment of the present invention, a circuit supplying a predetermined potential to the third wiring may be provided.

In one embodiment of the present invention, a pull-up circuit electrically connected to the second wiring may be provided.

In one embodiment of the present invention, configuration data can be stored in a configuration memory and whether the configuration data is stored in the configuration memory correctly can be verified. Thus, reliability can be improved.

BRIEF DESCRIPTION OF THE DRAWINGS

In the accompanying drawings:

FIG. 9 is a timing chart showing PLD operation;

DETAILED DESCRIPTION OF THE INVENTION

Embodiments of the present invention will be described in detail below with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments.

Note that a programmable logic device according to the present invention includes, in its category, a variety of semiconductor integrated circuits formed using semiconductor elements, such as microprocessors, image processing circuits, controllers for semiconductor display devices, digital signal processors (DSP), and microcontrollers. The semiconductor device according to the present invention includes, in its category, a variety of devices such as RF tags formed using any of the semiconductor integrated circuits and semiconductor display devices. The semiconductor display device includes, in its category, liquid crystal display devices, light-emitting devices in which a light-emitting element typified by an organic light-emitting element (OLED) is provided in each pixel, electronic paper, digital micromirror devices (DMD), plasma display panels (PDP), field emission displays (FED), and other semiconductor display devices in which semiconductor elements are included in driver circuits.

Embodiment 1

In this embodiment, an example of a semiconductor device according to one embodiment of the present invention is described. The semiconductor device according to one embodiment of the present invention can be used in a programmable logic device (hereinafter also referred to as a PLD).

Figure 1:
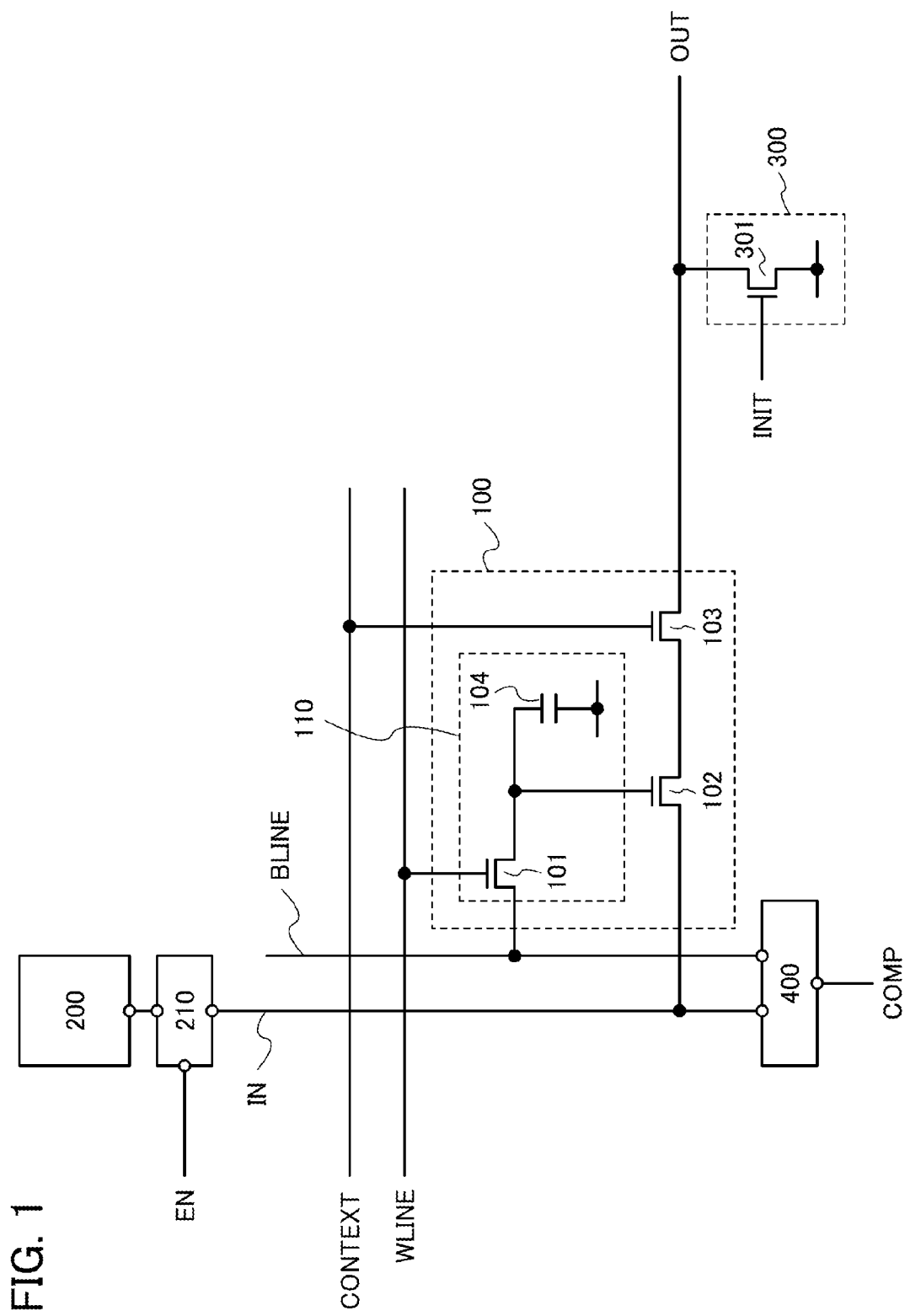
FIG. 1 is a circuit diagram illustrating a semiconductor device structure.

FIG. 1 illustrates a semiconductor device circuit diagram. A semiconductor device in FIG. 1 includes a cell 100 (also referred to as a configuration memory-routing switch or a switch), a logic element 200, an enable buffer 210, a reset circuit 300, and a read circuit 400. The cell 100 is connected to a wiring BLINE, a wiring IN, a wiring CONTEXT, a wiring WLINE, and a wiring OUT. The wiring OUT is connected to an input of the logic element 200. The logic element 200 is connected to the wiring IN through the enable buffer 210. The enable buffer 210 is connected to the logic element 200, a wiring EN, and the wiring IN. The reset circuit 300 is connected to a wiring INIT and the wiring OUT. The read circuit 400 is connected to a wiring COMP, the wiring IN, and the wiring BLINE. Configuration data $V_{BLINE}$ is input to the wiring BLINE. A signal $V_{CONTEXT}$ is input to the wiring CONTEXT. A signal $V_{WLINE}$ is input to the wiring WLINE. An enable signal $V_{EN}$ is input to the wiring EN. A reset signal $V_{INIT}$ is input to the wiring INIT. A signal $V_{COMP}$ is output from the wiring COMP.

Note that in this specification, the term "connection" means electrical connection and corresponds to a state where current, voltage, or a potential can be supplied or transmitted. Accordingly, a connection state does not always mean a direct connection state but includes an indirect connection state through a circuit element such as a wiring, a resistor, a diode, or a transistor so that current, voltage, or a potential can be supplied or transmitted.

The cell 100 has a function of controlling conduction or non-conduction between the wiring IN and the wiring OUT. Specifically, the cell 100 has a function of storing the configuration data $V_{BLINE}$ in response to the signal $V_{WLINE}$. The cell 100 also has a function of controlling the conduction or non-conduction between the wiring IN and the wiring OUT in accordance with the stored configuration data $V_{BLINE}$. Furthermore, the cell 100 has a function of bringing the wiring IN and the wiring OUT out of conduction regardless of the stored configuration data $V_{BLINE}$ in response to the signal $V_{CONTEXT}$.

The cell 100 can include a memory circuit 110 (also referred to as a configuration memory), a transistor 102, and a transistor 103 (see FIG. 1). The memory circuit 110 is connected to the wiring BLINE, the wiring WLINE, and a gate of the transistor 102. A first terminal, a second terminal, and the gate of the transistor 102 are connected to the wiring IN, a first terminal of the transistor 103, and the memory circuit 110, respectively. The first terminal, a second terminal, and a gate of the transistor 103 are connected to the second terminal of the transistor 102, the wiring OUT, and the wiring CONTEXT, respectively. The memory circuit 110 has a function of storing the configuration data $V_{BLINE}$ in response to the signal $V_{WLINE}$. The transistor 102 has a function of controlling conduction or non-conduction between the wiring IN and the first terminal of the transistor 103 in accordance with the configuration data $V_{BLINE}$ stored in the memory circuit 110. The transistor 103 has a function of controlling conduction or non-conduction between the second terminal of the transistor 102 and the wiring OUT in response to the signal $V_{CONTEXT}$.

Figure 2A:
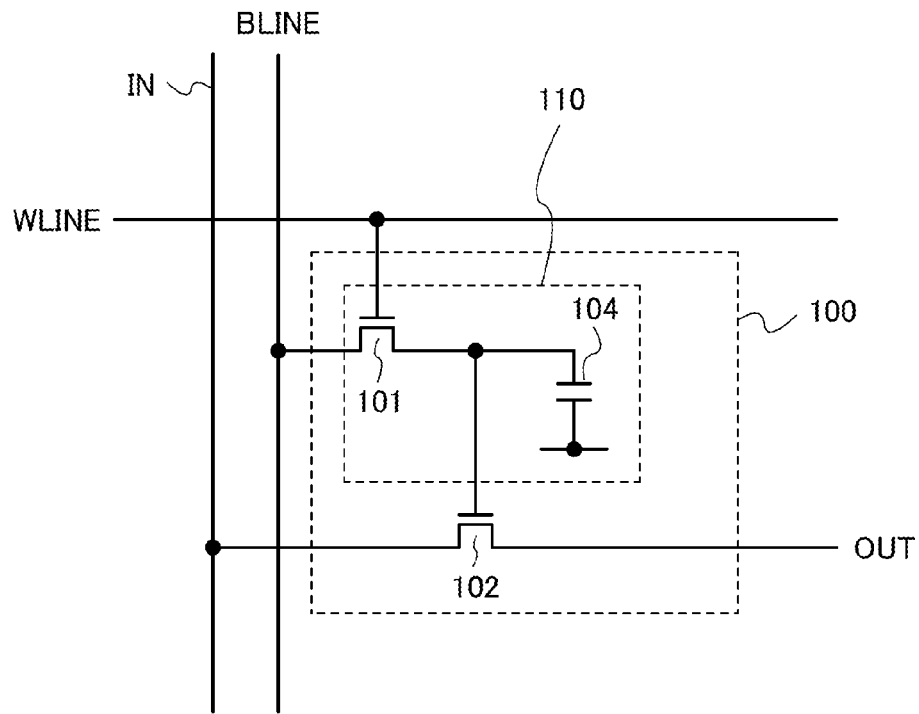
FIGS. 2A and 2B are circuit diagrams each illustrating a semiconductor device structure.

Note that in the cell 100 in FIG. 1, the transistor 103 and the wiring CONTEXT may be omitted (see FIG. 2A). Thus, the number of elements included in the cell 100 can be reduced, so that high integration can be achieved. In the case where the transistor 103 and the wiring CONTEXT are omitted, the second terminal of the transistor 102 is connected to the wiring OUT. The transistor 102 has a function of controlling the conduction or non-conduction between the wiring IN and the wiring OUT in accordance with the configuration data $V_{BLINE}$ stored in the memory circuit 110.

Figure 2B:
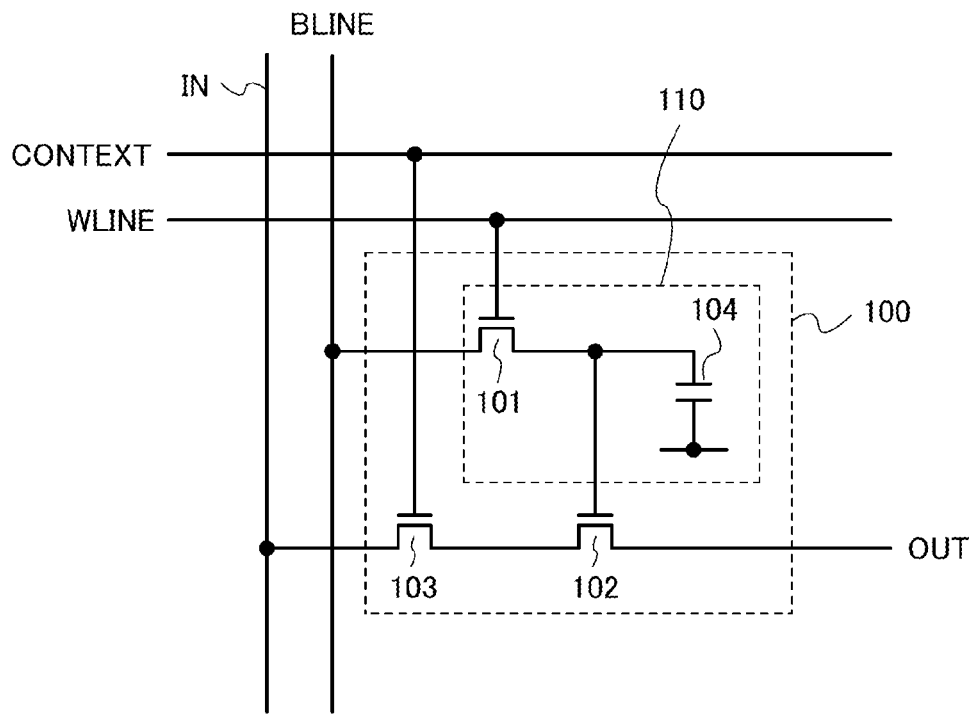

Note that in the cell 100 in FIG. 1, the transistor 103 may be provided between the wiring IN and the first terminal of the transistor 102 (see FIG. 2B). Thus, noise generated in the wiring OUT due to the signal $V_{CONTEXT}$ can be reduced. Accordingly, malfunction of a logic element or the like that is connected to the wiring OUT can be prevented. In the case where the transistor 103 is provided between the wiring IN and the first terminal of the transistor 102, the first terminal of the transistor 103, the second terminal of the transistor 103, and the second terminal of the transistor 102 are connected to the wiring IN, the first terminal of the transistor 102, and the wiring OUT, respectively. The transistor 103 has a function of controlling conduction or non-conduction between the wiring IN and the first terminal of the transistor 102 in response to the signal $V_{CONTEXT}$. The transistor 102 has a function of controlling conduction or non-conduction between the second terminal of the transistor 103 and the wiring OUT in accordance with the configuration data $V_{BLINE}$ stored in the memory circuit 110.

Note that a first terminal and a second terminal of a transistor mean one of a source and a drain and the other of the source and the drain, respectively. A source of a transistor means a source region that is part of an active layer or a source electrode that is connected to an active layer. Similarly, a drain of a transistor means a drain region that is part of an active layer or a drain electrode that is connected to an active layer. A gate means a gate electrode. The terms "source" and "drain" of a transistor interchange with each other depending on the conductivity type of the transistor or levels of potentials applied to terminals. In general, in an n-channel transistor, a terminal to which a low potential is applied is called a source, and a terminal to which a high potential is applied is called a drain. On the other hand, in a p-channel transistor, a terminal to which a low potential is applied is called a drain, and a terminal to which a high potential is applied is called a source.

The memory circuit 110 can include a transistor 101 and a capacitor 104 (see FIG. 1). When the memory circuit 110 has such a structure, the number of elements can be reduced, so that high integration can be achieved. A first terminal, a second terminal, and a gate of the transistor 101 are connected to the wiring BLINE, the gate of the transistor 102, and the wiring WLINE, respectively. A first electrode and a second electrode of the capacitor 104 are connected to the gate of the transistor 102 and a wiring supplied with a predetermined potential, respectively. The transistor 101 has a function of controlling conduction or non-conduction between the wiring BLINE and the gate of the transistor 102 in response to the signal $V_{WLINE}$. The capacitor 104 has a function of holding a potential difference between the gate of the transistor 102 and the wiring to which the second electrode of the capacitor 104 is connected.

Note that in the memory circuit 110 in FIG. 1, the capacitor 104 may be omitted. Thus, the number of elements can be further reduced, so that high integration can be achieved.

Figure 3A:
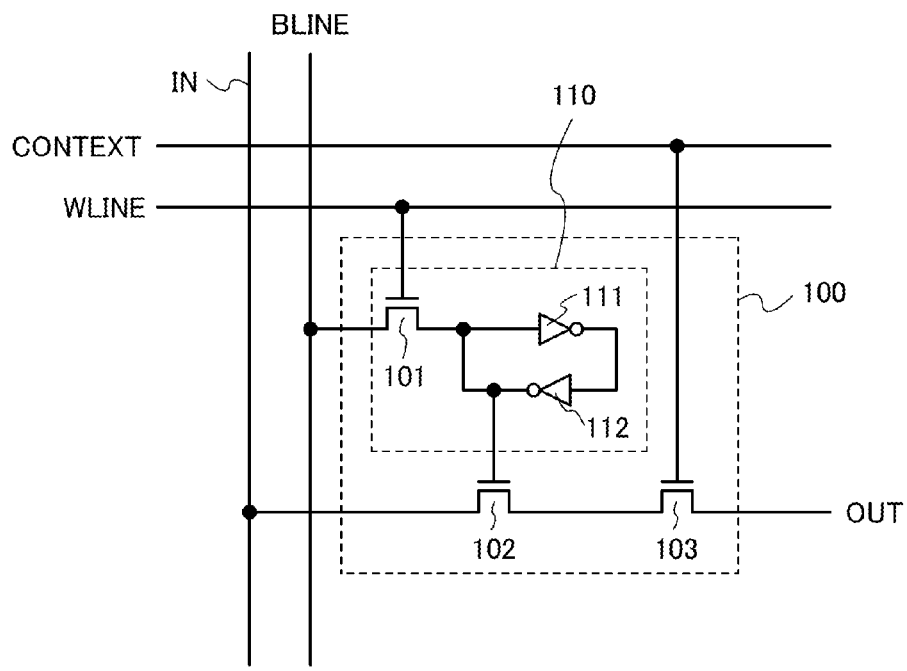
FIGS. 3A and 3B are circuit diagrams each illustrating a semiconductor device structure.

Note that in the memory circuit 110 in FIG. 1, the capacitor 104 may be replaced with an inverter circuit 111 and an inverter circuit 112 (see FIG. 3A). Accordingly, a circuit structure with high resistance to noise can be formed. An input terminal of the inverter circuit 111 is connected to the second terminal of the transistor 101, the gate of the transistor 102, and an output terminal of the inverter circuit 112. An output terminal of the inverter circuit 111 is connected to an input terminal of the inverter circuit 112. Note that the gate of the transistor 102 may be connected to the output terminal of the inverter circuit 111 and the input terminal of the inverter circuit 112. As each of the inverter circuit 111 and the inverter circuit 112, a circuit functioning as an inverter circuit, i.e., a circuit having functions of inverting an input signal and outputting the inverted signal (e.g., a NAND circuit, a NOR circuit, or a clocked inverter circuit) may be used.

Note that in the memory circuit 110 in FIG. 1 and FIGS. 2A and 2B, the off-state current of the transistor 101 is preferably extremely low because electric charge held in the gate of the transistor 102 or the capacitor 104 can be prevented from leaking through the transistor 101. Consequently, the configuration data $V_{BLINE}$ can be retained for a long time. A transistor can have extremely low off-state current when the transistor includes, in a channel formation region, a film of a semiconductor whose band gap is wider than that of silicon and whose intrinsic carrier density is lower than that of silicon. Examples of such a semiconductor are an oxide semiconductor, silicon carbide, and gallium nitride, which have a band gap approximately 2 or more times that of silicon.

Note that in the memory circuit 110 in FIG. 1 and FIGS. 2A and 2B, W/L (W and L indicate channel width and channel length, respectively) of the transistor 101 is preferably larger than that of the transistor 102 and/or the transistor 103 because the configuration data $V_{BLINE}$ can be stored rapidly even when the transistor 101 has low mobility.

Figure 3B:
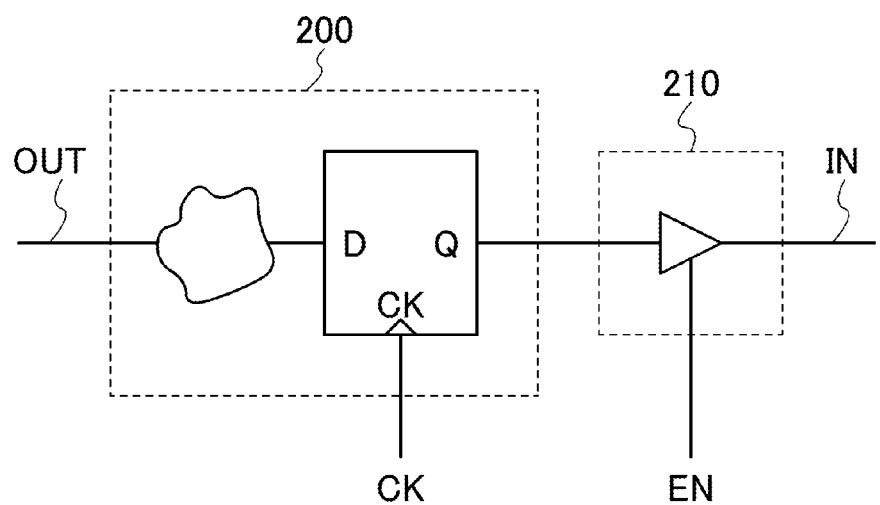

The logic element 200 is formed using a flip-flop and/or a look-up table, for example. An output of the logic element 200 is input to another logic element through the cell 100. The logic element 200 is formed using a flip-flop that loads data in synchronization with the rising edge of a clock signal $V_{CK}$ input from a wiring CK, i.e., a so-called edge-sensitive latch (see FIG. 3B).

The enable buffer 210 has a function of controlling whether to output an output signal of the logic element 200 (including a signal based on the output signal) to the wiring IN in response to the enable signal $V_{EN}$. In the case where the output signal of the logic element 200 is not output to the wiring IN, the enable buffer 210 has a function of bringing its output into high impedance. The enable buffer 210 can be a circuit having a function of bringing its output into high impedance (e.g., a switch such as an analog switch, a three-state buffer, a clocked inverter, or a circuit including any one of these).

Note that the logic element 200 may have a function of bringing its output into high impedance. In that case, the enable buffer 210 may be omitted.

The reset circuit 300 has a function of initializing the potential of the wiring OUT. Specifically, the reset circuit 300 has a function of controlling whether to supply a potential $V_{REST}$ to the wiring OUT in response to the reset signal $V_{INIT}$. The potential $V_{REST}$ is preferably one of a potential for making the potential of the wiring OUT low or a potential for making the potential of the wiring OUT high.

A transistor 301 can be used as the reset circuit 300 (see FIG. 1). A first terminal, a second terminal, and a gate of the transistor 301 are connected to the wiring OUT, a wiring, and the wiring INIT, respectively. The transistor 301 has a function of controlling conduction or non-conduction between the wiring OUT and the wiring to which the second terminal of the transistor 301 is connected in response to the reset signal $V_{INIT}$. The potential $V_{REST}$ is supplied to the wiring to which the second terminal of the transistor 301 is connected.

Note that by inputting the enable signal $V_{EN}$ or a signal based on the enable signal $V_{EN}$ to the wiring INIT, the enable signal $V_{EN}$ or the signal based on the enable signal $V_{EN}$ may control the reset circuit 300. Thus, the kind of signal can be reduced.

Note that the second electrode of the capacitor 104 may be connected to the second terminal of the transistor 301. Thus, the number of wirings can be reduced.

Note that the transistor 301 may have current supply capability, for example, for making the potential of the wiring OUT or the wiring IN low. Thus, W/L of the transistor 301 is preferably smaller than that of the transistor 101, the transistor 102 and/or the transistor 103. Accordingly, high integration can be achieved.

The read circuit 400 has functions of detecting the potential of the wiring IN and outputting the signal $V_{COMP}$ based on the detection result to the wiring COMP. For example, the read circuit 400 has functions of comparing the potential of the wiring IN with the potential of the wiring BLINE and outputting the signal $V_{COMP}$ based on the comparison result to the wiring COMP. Alternatively, the read circuit 400 has functions of determining whether the potential of the wiring IN is high or low and outputting the signal $V_{COMP}$ based on the determination result to the wiring COMP. In that case, the read circuit 400 is not necessarily connected to the wiring BLINE.

Figure 4A:
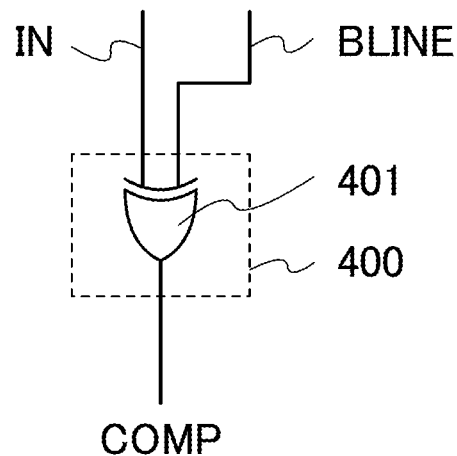
FIGS. 4A to 4C are circuit diagrams each illustrating a semiconductor device structure.

An exclusive OR circuit 401 can be used as the read circuit 400 (see FIG. 4A). A first input terminal, a second input terminal, and an output terminal of the exclusive OR circuit 401 are connected to the wiring IN, the wiring BLINE, and the wiring COMP, respectively. In the case where the potential of the wiring IN and the configuration data $V_{BLINE}$ have different high or low levels, the exclusive OR circuit 401 outputs the high-level signal $V_{COMP}$ to the wiring COMP. In the case where the potential of the wiring IN and the configuration data $V_{BLINE}$ have the same high or low level, the exclusive OR circuit 401 outputs the low-level signal $V_{COMP}$ to the wiring COMP. Note that the read circuit 400 is not limited to the exclusive OR circuit 401, and the read circuit 400 may be a known read circuit such as a sense amplifier.

Figure 4B:
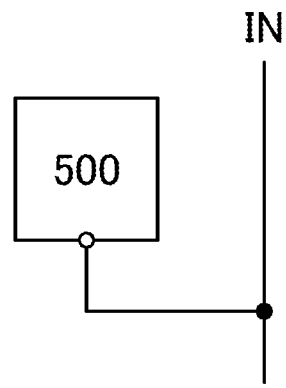

Here, the semiconductor device in FIG. 1 may include a circuit 500 that is connected to the wiring IN (see FIG. 4B). As the circuit 500, a circuit having a function of pulling up the wiring IN to a high level, a circuit having a function of pulling down the wiring IN to a low level, a circuit having a function of supplying a predetermined potential to the wiring IN, or the like can be used. Further, the potential supplied from the circuit 500 to the wiring IN is preferably different from the potential $V_{REST}$. For example, in the case where the potential $V_{REST}$ makes the potential of the wiring OUT low, the potential supplied from the circuit 500 to the wiring IN preferably makes the potential of the wiring IN high, whereas in the case where the potential $V_{REST}$ makes the potential of the wiring OUT high, the potential supplied from the circuit 500 to the wiring IN preferably makes the potential of the wiring IN low.

Figure 4C:
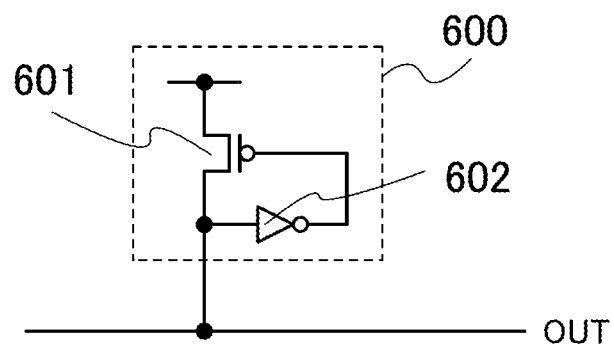

Further, the semiconductor device in FIG. 1 may include a latch circuit 600 that is connected to the wiring OUT (see FIG. 4C). The latch circuit 600 has functions of latching and holding the potential of the wiring OUT. When the semiconductor device in FIG. 1 includes the latch circuit 600, the potential of the wiring OUT can be kept constant even if the wiring IN and the wiring OUT are out of conduction. Accordingly, the semiconductor device can have high resistance to noise.

The latch circuit 600 can include a transistor 601 and an inverter circuit 602 (see FIG. 4C). A first terminal and a second terminal of the transistor 601 are connected to the wiring OUT and a wiring to which a predetermined potential is supplied, respectively. An input terminal and an output terminal of the inverter circuit 602 are connected to the wiring OUT and a gate of the transistor 601, respectively. The transistor 601 has a function of controlling conduction or non-conduction between the wiring OUT and the wiring to which the second terminal of the transistor 601 is connected in response to an output signal of the inverter circuit 602. The inverter circuit 602 has a function of outputting a signal obtained by inversion of the potential of the wiring OUT to the gate of the transistor 601. For example, the transistor 601 is a p-channel transistor and a potential for making the potential of the wiring OUT high is supplied to the wiring to which the second terminal of the transistor 601 is connected. In that case, when the potential of the wiring OUT is set high, the inverter circuit 602 outputs a low-level signal to the gate of the transistor 601. Thus, the transistor 601 is turned on, so that the potential for making the potential of the wiring OUT high is supplied to the wiring OUT through the transistor 601.

Next, an operation example of the semiconductor device in FIG. 1 is described.

Note that as a matter of convenience, in the cell 100 or the memory circuit 110, the configuration data $V_{BLINE}$ is stored when the signal $V_{WLINE}$ is high, and the configuration data $V_{BLINE}$ is not stored when the signal $V_{WLINE}$ is low. Specifically, the transistor 101 is turned on when the signal $V_{WLINE}$ is high, and the transistor 101 is turned off when the signal $V_{WLINE}$ is low. Further, in the cell 100, the wiring IN and the wiring OUT are brought into conduction when the signal $V_{CONTEXT}$ is high and the configuration data $V_{BLINE}$ stored in the cell 100 is high; the wiring IN and the wiring OUT are brought out of conduction when the signal $V_{CONTEXT}$ is high and the configuration data $V_{BLINE}$ stored in the cell 100 is low; and the wiring IN and the wiring OUT are brought out of conduction regardless of the configuration data $V_{BLINE}$ stored in the cell 100 when the signal $V_{CONTEXT}$ is low. Specifically, the transistor 102 is turned on when the configuration data $V_{BLINE}$ stored in the memory circuit 110 is high, and the transistor 102 is turned off when the configuration data $V_{BLINE}$ stored in the memory circuit 110 is low. The transistor 103 is turned on when the signal $V_{CONTEXT}$ is high, and the transistor 103 is turned off when the signal $V_{CONTEXT}$ is low. In the enable buffer 210, an output signal of the logic element 200 is output to the wiring IN through the enable buffer 210 when the enable signal $V_{EN}$ is high; and an output signal of the logic element 200 is not output to the wiring IN and an output from the enable buffer 210 has high impedance when the enable signal $V_{EN}$ is low. In the reset circuit 300, a potential $V_{RESET}$ is supplied to the wiring OUT when the reset signal $V_{INIT}$ is high, and the potential $V_{RESET}$ is not supplied to the wiring OUT when the reset signal $V_{INIT}$ is low. The potential $V_{RESET}$ makes the potential of the wiring OUT low. The wiring IN is pulled up to a high level.

Figure 5:
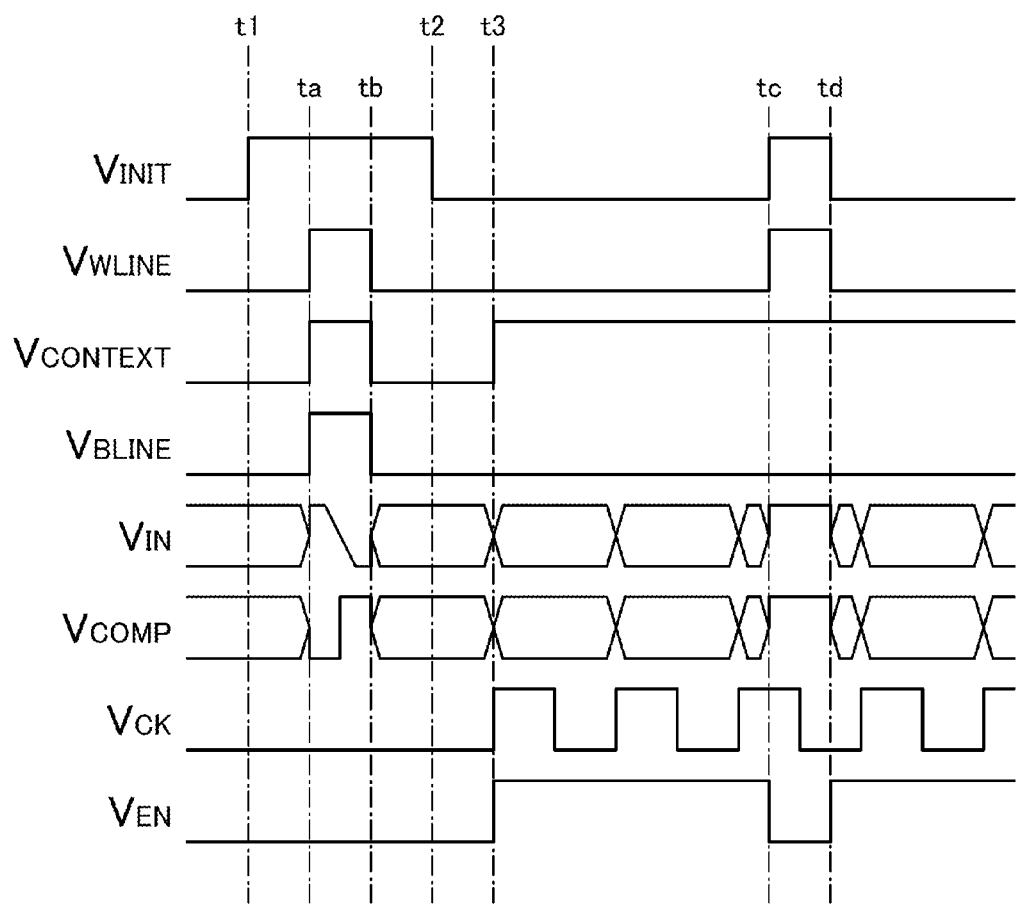
FIG. 5 is a timing chart showing semiconductor device operation.

FIG. 5 is an example of a timing chart that can be used for the semiconductor device in FIG. 1. In the timing chart of FIG. 5, in a period from times t1 to t2, the configuration data $V_{BLINE}$ is stored in the cell 100 and whether the configuration data $V_{BLINE}$ is stored in the cell 100 correctly is determined. After time t3, connection between the wiring IN and the wiring OUT is set in accordance with the configuration data $V_{BLINE}$ stored in the cell 100 in the period from the times t1 to t2. Note that in the timing chart of FIG. 5, the high-level configuration data $V_{BLINE}$ is stored in the cell 100 in the period from the times t1 to t2.

First, in the period from the times t1 to t2, the reset signal $V_{INIT}$ is set high, so that the potential $V_{RESET}$ is supplied from the reset circuit 300 to the wiring OUT. In addition, the enable signal $V_{EN}$ is set low, so that the output of the enable buffer 210 has high impedance. In a period from times ta to tb in the period from the times t1 to t2, the signal $V_{WLINE}$ is set high, so that the configuration data $V_{BLINE}$ is stored in the cell 100. Specifically, the transistor 101 is turned on, and the configuration data $V_{BLINE}$ is input to the gate of the transistor 102 and the first electrode of the capacitor 104. Further, the signal $V_{CONTEXT}$ is set high. Thus, the conduction or non-conduction between the wiring IN and the wiring OUT is controlled in accordance with the configuration data $V_{BLINE}$ stored in the cell 100. Specifically, the transistor 103 is turned on, so that the conduction or non-conduction between the wiring IN and the wiring OUT is controlled in accordance with the on state or off state of the transistor 102. When the configuration data $V_{BLINE}$ stored in the cell 100 is high, the wiring IN and the wiring OUT are brought into conduction. Specifically, the transistor 102 and the transistor 103 are both turned on, so that the wiring IN and the wiring OUT are brought into conduction. In that case, the potential $V_{RESET}$ supplied to the wiring OUT is supplied to the wiring IN through the cell 100; thus, the potential of the wiring IN is set low. On the other hand, when the configuration data $V_{BLINE}$ stored in the cell 100 is low, the wiring IN and the wiring OUT are brought out of conduction. Specifically, the transistor 103 is turned on but the transistor 102 is turned off; thus, the wiring IN and the wiring OUT are brought out of conduction. In that case, the potential $V_{RESET}$ is not supplied to the wiring IN, so that the wiring IN becomes floating. Thus, when the wiring IN is pulled up to a high level, the potential of the wiring IN is set high.

When the configuration data $V_{BLINE}$ input to the wiring BLINE and the configuration data $V_{BLINE}$ stored in the cell 100 are both high, the potential of the wiring IN is set low; thus, the signal $V_{COMP}$ output from the read circuit 400 to the wiring COMP is set high. On the other hand, when the configuration data $V_{BLINE}$ input to the wiring BLINE and the configuration data $V_{BLINE}$ stored in the cell 100 are both low, the potential of the wiring IN is set high; thus, the signal $V_{COMP}$ output from the read circuit 400 to the wiring COMP is set high.

Here, when the signal $V_{COMP}$ is set high, it indicates that the configuration data $V_{BLINE}$ input to the wiring BLINE agrees with the configuration data $V_{BLINE}$ stored in the cell 100 actually. In other words, it indicates that the configuration data $V_{BLINE}$ is stored in the cell 100 correctly. In contrast, when the signal $V_{COMP}$ is set low, it indicates that the configuration data $V_{BLINE}$ is not stored in the cell 100 correctly. For example, the wiring IN and the wiring OUT are brought out of conduction though the configuration data $V_{BLINE}$ input to the wiring BLINE is high. In that case, the potential $V_{RESET}$ is not supplied to the wiring IN; thus, the potential of the wiring IN is set high. Accordingly, the signal $V_{COMP}$ is set low. Further, the wiring IN and the wiring OUT are brought into conduction though the configuration data $V_{BLINE}$ input to the wiring BLINE is low. In that case, the potential $V_{RESET}$ is input to the wiring IN through the cell 100; thus, the potential of the wiring IN is set low. Consequently, the signal $V_{COMP}$ is set low.

Note that in the period from the times t1 to t2, supply of the clock signal $V_{CK}$ to the wiring CK is preferably stopped. Consequently, power consumption can be reduced.

Next, after the time t3, the reset signal $V_{INIT}$ is set low; thus, the potential $V_{RESET}$ is not supplied to the wiring OUT. When the enable signal $V_{EN}$ is set high, the output signal of the logic element 200 is output from the enable buffer 210 to the wiring IN. In addition, the signal $V_{WLINE}$ is set low; thus, the configuration data $V_{BLINE}$ is not stored in the cell 100. Note that the configuration data $V_{BLINE}$ stored in the period from the times t1 to t2 is retained in the cell 100. Specifically, the transistor 101 is turned off, so that the gate of the transistor 102 and the first electrode of the capacitor 104 become floating. Note that electric charge based on the configuration data $V_{BLINE}$ input in the period from the times t1 to t2 is stored in the gate capacitance of the transistor 102 and the capacitor 104; thus, the potentials of the gate of the transistor 102 and the first electrode of the capacitor 104 are based on the configuration data $V_{BLINE}$ input in the period from the times t1 to t2. Further, the signal $V_{CONTEXT}$ is set high. Thus, the conduction or non-conduction between the wiring IN and the wiring OUT is controlled in accordance with the configuration data $V_{BLINE}$ stored in the cell 100 in the period from the times t1 to t2. Specifically, the transistor 103 is turned on, so that the conduction or non-conduction between the wiring IN and the wiring OUT is controlled in accordance with the on state or off state of the transistor 102. When the configuration data $V_{BLINE}$ stored in the cell 100 in the period from the times t1 to t2 is high, the wiring IN and the wiring OUT are brought into conduction. Specifically, the transistor 102 and the transistor 103 are both turned on, so that the wiring IN and the wiring OUT are brought into conduction. In that case, the signal output from the logic element 200 to the wiring IN is output to the wiring OUT through the cell 100. On the other hand, when the configuration data $V_{BLINE}$ stored in the cell 100 in the period from the times t1 to t2 is low, the wiring IN and the wiring OUT are brought out of conduction. Specifically, the transistor 103 is turned on but the transistor 102 is turned off; thus, the wiring IN and the wiring OUT are brought out of conduction. In that case, the signal output from the logic element 200 to the wiring IN is not output to the wiring OUT.

As described above, the conduction or non-conduction between the wiring IN and the wiring OUT can be controlled in accordance with the configuration data $V_{BLINE}$ stored in the cell 100. In other words, whether to output the output signal of the logic element 200 to the wiring OUT can be controlled. Further, whether the configuration data $V_{BLINE}$ is stored in the cell 100 correctly when it is stored in the cell 100 can be checked easily. Thus, reliability can be improved.

Note that while the semiconductor device operates, another configuration data $V_{BLINE}$ may be stored in the cell 100 to change the conduction or non-conduction between the wiring IN and the wiring OUT. The operation of the semiconductor device in the case of storing another configuration data $V_{BLINE}$ in the cell 100 in a period from times tc to td after the time t3 is described below. The period from the times tc to td is a period between two consecutive rising edges of the clock signal $V_{CK}$. Note that in the timing chart of FIG. 5, the low-level configuration data $V_{BLINE}$ is stored in the cell 100 in the period from the times tc to td.

In the period from the times tc to td, the reset signal $V_{INIT}$ is set high, so that the potential $V_{RESET}$ is supplied from the reset circuit 300 to the wiring OUT. In addition, the enable signal $V_{EN}$ is set low, so that the output of the enable buffer 210 has high impedance. In addition, the signal $V_{WLINE}$ is set high, so that the configuration data $V_{BLINE}$ is stored in the cell 100. Further, the signal $V_{CONTEXT}$ is set high. Thus, the conduction or non-conduction between the wiring IN and the wiring OUT is controlled in accordance with the configuration data $V_{BLINE}$ stored in the cell 100. When the configuration data $V_{BLINE}$ stored in the cell 100 is high, the wiring IN and the wiring OUT are brought into conduction. In that case, the potential $V_{RESET}$ supplied to the wiring OUT is supplied to the wiring IN through the cell 100; thus, the potential of the wiring IN is set low. On the other hand, when the configuration data $V_{BLINE}$ stored in the cell 100 is low, the wiring IN and the wiring OUT are brought out of conduction. In that case, the potential $V_{RESET}$ is not supplied to the wiring IN, so that the wiring IN becomes floating. Thus, when the wiring IN is pulled up to a high level, the potential of the wiring IN is set high.

When the configuration data $V_{BLINE}$ input to the wiring BLINE and the configuration data $V_{BLINE}$ stored in the cell 100 are both high, the potential of the wiring IN is set low; thus, the signal $V_{COMP}$ output from the read circuit 400 to the wiring COMP is set high. On the other hand, when the configuration data $V_{BLINE}$ input to the wiring BLINE and the configuration data $V_{BLINE}$ stored in the cell 100 are both low, the potential of the wiring IN is set high; thus, the signal $V_{COMP}$ output from the read circuit 400 to the wiring COMP is set high.

Next, after the time td, the reset signal $V_{INIT}$ is set low; thus, the potential $V_{RESET}$ is not supplied to the wiring OUT. When the enable signal $V_{EN}$ is set high, the output signal of the logic element 200 is output from the enable buffer 210 to the wiring IN. In addition, the signal $V_{WLINE}$ is set low; thus, the configuration data $V_{BLINE}$ is not stored in the cell 100. Note that the configuration data $V_{BLINE}$ stored in the period from the times tc to td is retained in the cell 100. Further, the signal $V_{CONTEXT}$ is set high. Thus, the conduction or non-conduction between the wiring IN and the wiring OUT is controlled in accordance with the configuration data $V_{BLINE}$ stored in the cell 100 in the period from the times tc to td. When the configuration data $V_{BLINE}$ stored in the cell 100 in the period from the times tc to td is high, the wiring IN and the wiring OUT are brought into conduction. In that case, the signal output from the logic element 200 to the wiring IN is output to the wiring OUT through the cell 100. On the other hand, when the configuration data $V_{BLINE}$ stored in the cell 100 in the period from the times tc to td is low, the wiring IN and the wiring OUT are brought out of conduction. In that case, the signal output from the logic element 200 to the wiring IN is not output to the wiring OUT.

As described above, even while the semiconductor device operates, another configuration data $V_{BLINE}$ can be stored in the cell 100, and whether the configuration data $V_{BLINE}$ is stored in the cell 100 correctly can be checked easily.

This embodiment can be combined with any of the other embodiments as appropriate.

Embodiment 2

In this embodiment, an example of a PLD including the semiconductor device in Embodiment 1 is described.

Figure 6:
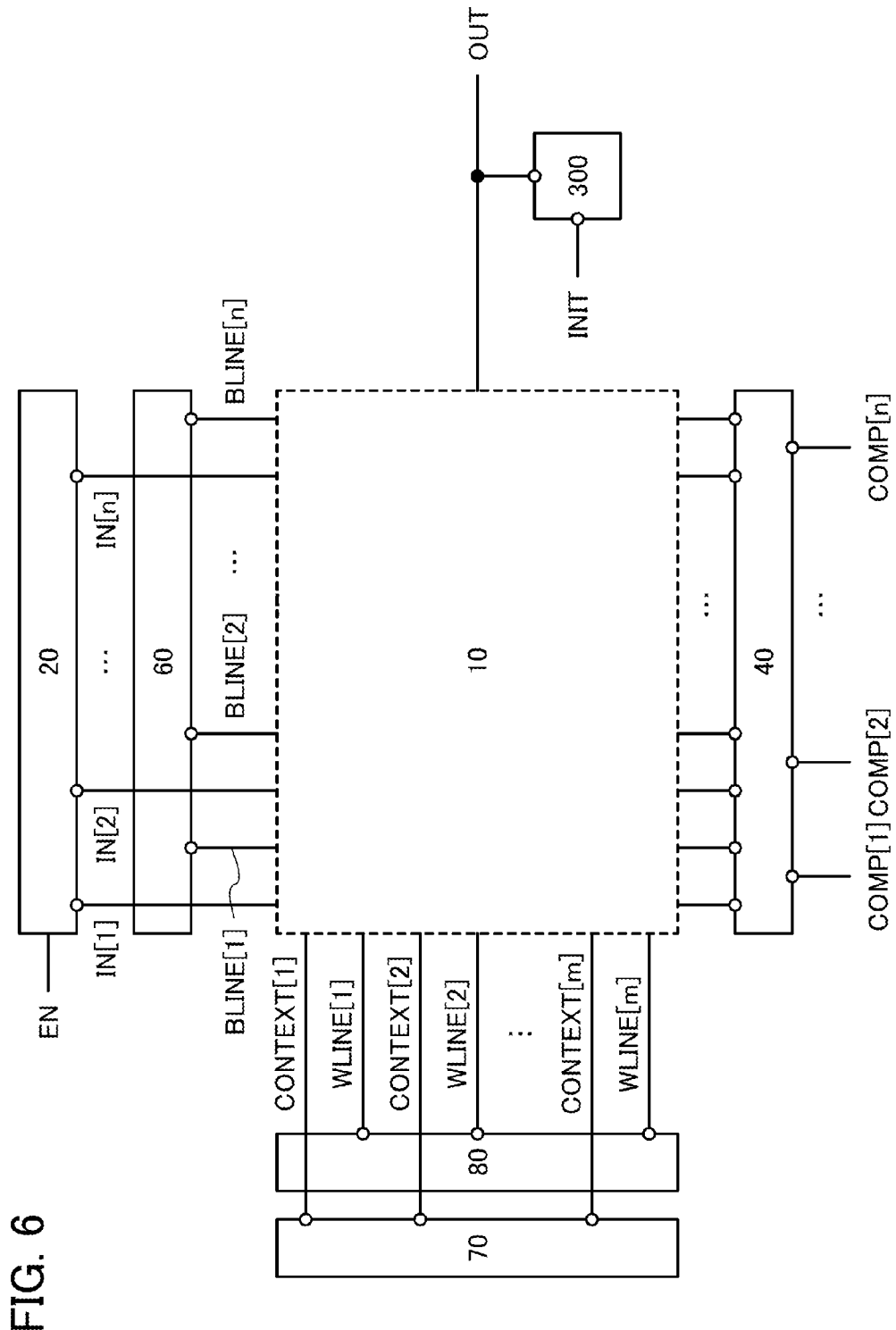
FIG. 6 is a circuit diagram illustrating a PLD structure.
Figure 7:
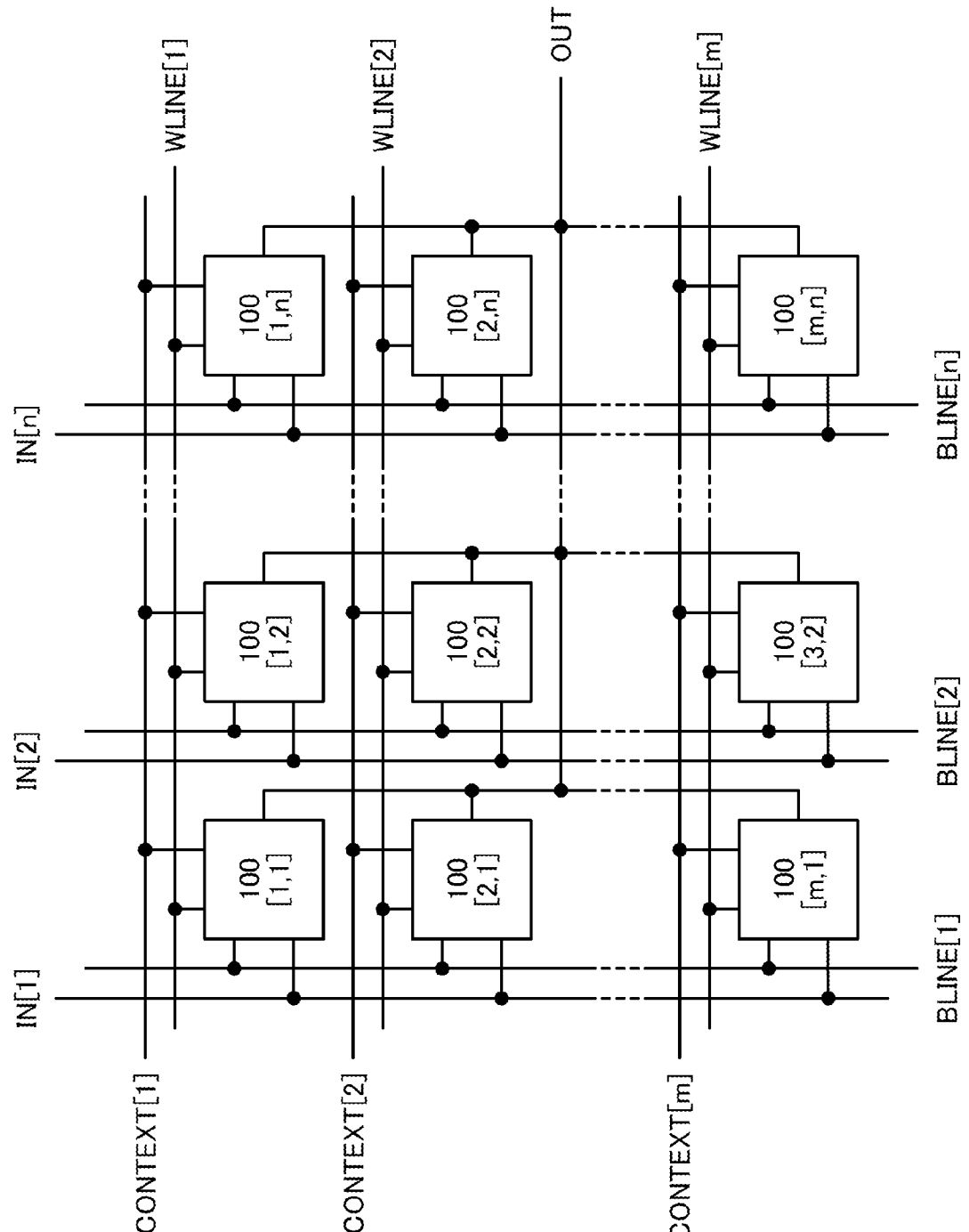
FIG. 7 is a circuit diagram illustrating a PLD structure.

FIG. 6 is a circuit diagram of a PLD according to one embodiment of the present invention, and FIG. 7 is a circuit diagram of a cell portion 10. The PLD in FIG. 6 includes the cell portion 10, a logic element portion 20, a read portion 40, a write driver 60, a driver circuit 70, a driver circuit 80, and the reset circuit 300. The cell portion 10 is connected to n (n is a natural number of 2 or more) wirings IN (hereinafter also referred to as wirings IN[1] to IN[n]), n wirings BLINE (hereinafter also referred to as wirings BLINE[1] to BLINE[n]), m (m is a natural number of 2 or more) wirings CONTEXT (hereinafter also referred to as wirings CONTEXT[1] to CONTEXT[m]), m wirings WLINE (hereinafter also referred to as wirings WLINE[1] to WLINE[m]), and the wiring OUT. The logic element portion 20 is connected to the wirings IN[1] to IN[n] and the wiring EN. The read portion 40 is connected to the wirings IN[1] to IN[n], the wirings BLINE[1] to BLINE[m], and n wirings COMP (hereinafter also referred to as wirings COMP[1] to COMP[n]). The write driver 60 is connected to the wirings BLINE[1] to BLINE[n]. The driver circuit 70 is connected to the wirings CONTEXT[1] to CONTEXT[m]. The driver circuit 80 is connected to the wirings WLINE[1] to WLINE[m]. The reset circuit 300 is connected to the wiring OUT and the wiring INIT. Configuration data $V_{BLINE}[1]$ to $V_{BLINE}[n]$ are input from the write driver 60 to the wirings BLINE[1] to BLINE[n], respectively. Signals $V_{CONTEXT}[1]$ to $V_{CONTEXT}[m]$ are input from the driver circuit 70 to the wirings CONTEXT[1] to CONTEXT[m], respectively. Signals $V_{WLINE}[1]$ to $V_{WLINE}[m]$ are input from the driver circuit 80 to the wirings WLINE[1] to WLINE[m], respectively. Signals $V_{COMP}[1]$ to $V_{COMP}[n]$ are input from the read portion 40 to the wirings COMP[1] to COMP[n], respectively.

The cell portion 10 has a function of controlling conduction or non-conduction between the wirings IN[1] to IN[n] and the wiring OUT. Specifically, the cell portion 10 includes cells 100 in m rows and n columns (hereinafter also referred to as cells 100[1,1] to 100[m,n]) (see FIG. 7). Each of the cells 100[1,1] to 100[m,n] corresponds to the cell 100 in Embodiment 1 and has a function similar to that of the cell 100 in Embodiment 1. The cell 100 in an i-th (i is any one of 1 to m) row and a j-th (j is any one of 1 to n) column is described as an example. The cell 100[i,j] is connected to the wiring IN[j], the wiring BLINE[j], the wiring CONTEXT[i], the wiring WLINE[i], and the wiring OUT. In addition, the cell 100[i,j] has a function of controlling conduction or non-conduction between the wiring IN[j] and the wiring OUT.

Note that in the case where the cell 100 does not include the transistor 103 (for example, see FIG. 2A), the cells 100[1,1] to 100[m,n] may be provided in only one row, and the wirings CONTEXT[1] to CONTEXT[m] and the driver circuit 70 may be omitted.

Note that in the case where the cell 100 includes the capacitor 104 (for example, see FIG. 1), the second electrode of the capacitor 104 may be connected to the wiring WLINE in another row or the wiring CONTEXT in another row. Thus, the number of wirings can be reduced. The cells 100 in the i-th row are described as an example. In the cells 100[i,1] to 100[i,n], the second electrode of the capacitor 104 may be connected to any one of the wirings WLINE[1] to WLINE[i−1], any one of the wirings WLINE[i+1] to WLINE[m], any one of the wirings CONTEXT[1] to CONTEXT[i−1], or any one of the wirings CONTEXT[i+1] to CONTEXT[m]. Note that in the case where the second electrode of the capacitor 104 is connected to the wiring WLINE in another row or the wiring CONTEXT in another row, the configuration data $V_{BLINE}$ retained in the memory circuit 110 might be inverted by capacitive coupling. However, in the case where the configuration data $V_{BLINE}$ retained in the memory circuit 110 is inverted by capacitive coupling, the cell 100 does not malfunction because at least the transistor 103 is off. Further, when the transistor 103 is on, the cell 100 does not malfunction because the configuration data $V_{BLINE}$ retained in the memory circuit 110 is recovered by returning the potential of the wiring WLINE or the wiring CONTEXT to which the second electrode of the capacitor 104 is connected to the potential at the time of writing the configuration data $V_{BLINE}$.

Figure 8A:
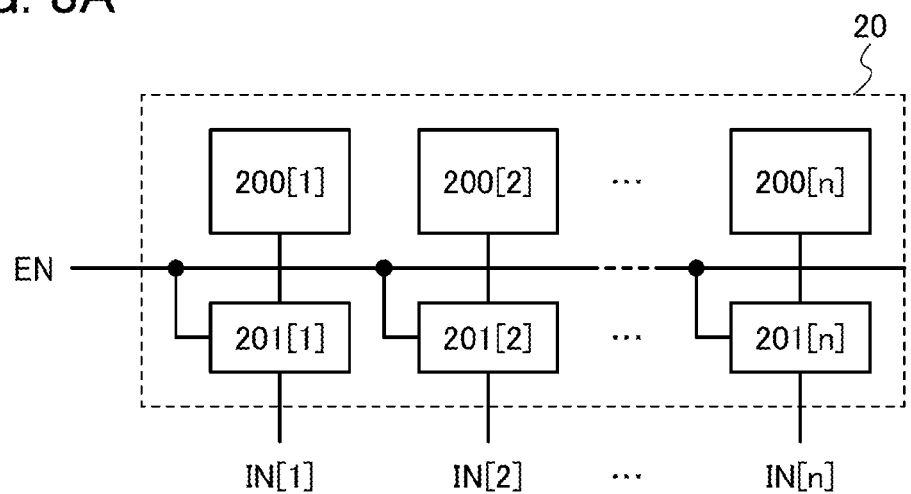
FIGS. 8A and 8B are circuit diagrams each illustrating a PLD structure.

The logic element portion 20 includes n logic elements 200 (hereinafter also referred to as logic elements 200[1] to 200[n]) and n enable buffers 210 (hereinafter also referred to as enable buffers 210[1] to 210[n]) (see FIG. 8A). Each of the logic elements 200[1] to 200[n] corresponds to the logic element 200 in Embodiment 1 and has a function similar to that of the logic element 200 in Embodiment 1. Each of the enable buffers 210[1] to 210[n] corresponds to the enable buffer 210 in Embodiment 1 and has a function similar to that of the enable buffer 210 in Embodiment 1. The logic element 200 and the enable buffer 210 in the j-th column are described as an example. The logic element 200[j] is connected to the wiring IN[j] through the enable buffer 210[j]. The enable buffer 210[j] is connected to the logic element 200[j], the wiring IN[j], and the wiring EN.

Figure 8B:
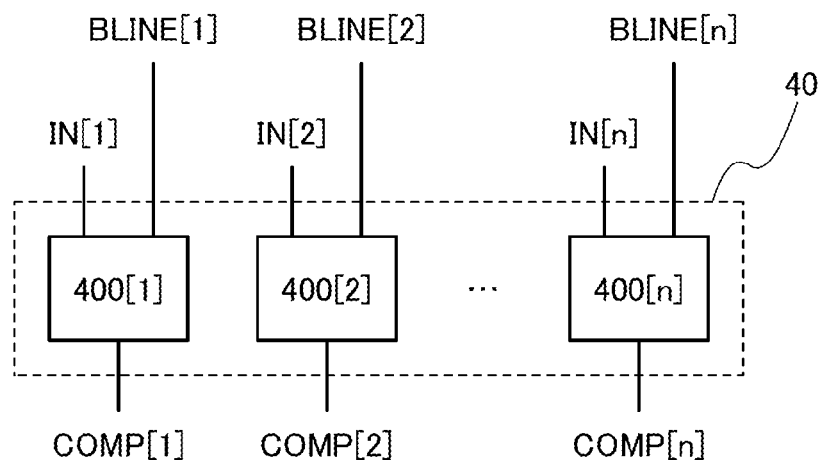

The read portion 40 includes n read circuits 400 (hereinafter also referred to as read circuits 400[1] to 400[n]) (see FIG. 8B). Each of the read circuits 400[1] to 400[n] corresponds to the read circuit 400 in Embodiment 1 and has a function similar to that of the read circuit 400 in Embodiment 1. The read circuit 400 in the j-th column is described as an example. The read circuit 400[j] is connected to the wiring IN[j], the wiring BLINE[j], and the wiring COMP[j].

Note that in the read portion 40, all the signals $V_{COMP}[1]$ to $V_{COMP}[n]$ may be output outside. In that case, whether the configuration data $V_{BLINE}$ is stored correctly in each of the cells 100 can be detected; thus, the cell 100 that does not store the configuration data $V_{BLINE}$ correctly can be specified easily.

Note that in the read portion 40, ANDs of the signals $V_{COMP}[1]$ to $V_{COMP}[n]$ may be output. In that case, whether the configuration data $V_{BLINE}$ is stored correctly in all the cells 100 in each row can be detected, and the number of signals output outside can be reduced drastically.

The write driver 60 has a function of outputting the configuration data $V_{BLINE}[1]$ to $V_{BLINE}[n]$ to the wirings BLINE[1] to BLINE[n], respectively. The write driver 60 can include a shift register.

The driver circuit 70 has a function of outputting the signals $V_{CONTEXT}[1]$ to $V_{CONTEXT}[m]$ to the wirings CONTEXT[1] to CONTEXT[m], respectively. The driver circuit 70 can include a shift register or a decoder.

The driver circuit 80 has a function of outputting the signals $V_{WLINE}[1]$ to $V_{WLINE}[m]$ to the wirings WLINE[1] to WLINE[m], respectively. The driver circuit 80 can include a shift register or a decoder.

Next, an operation example of the PLD in FIG. 7 is described.

Figure 10:
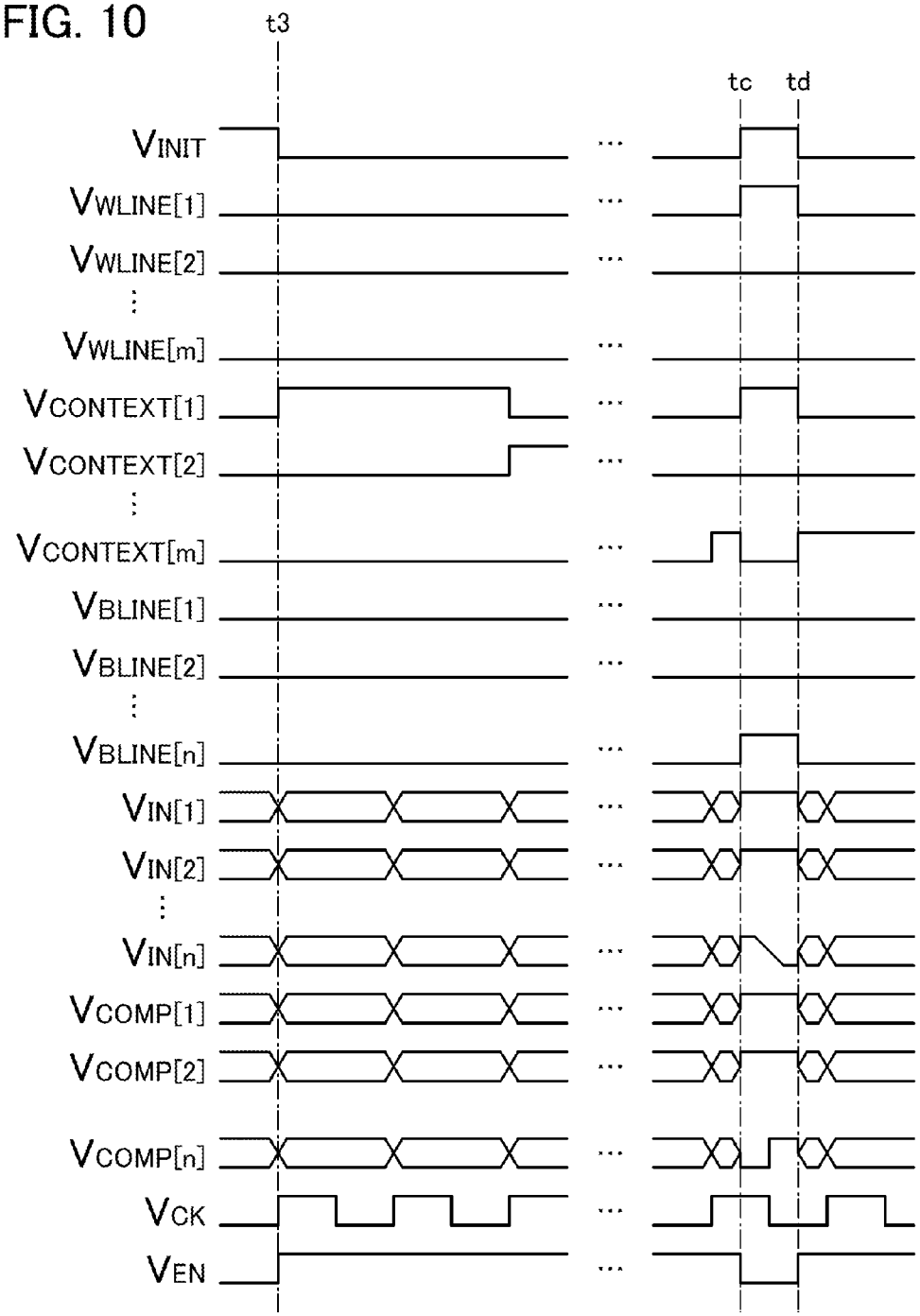
FIG. 10 is a timing chart showing PLD operation.

FIG. 9 and FIG. 10 are timing charts that can be used for the PLD in FIG. 7. The timing chart in FIG. 9 shows the period from the times t1 to t2 in which the configuration data $V_{BLINE}$ is stored in the cells 100[1,1] to 100[m,n] and whether configuration data $V_{BLINE}$ can be stored correctly is checked. The timing chart in FIG. 10 shows a period after the time t3 in which connection between the wirings IN[1] to IN[n] and the wiring OUT is set in accordance with the configuration data $V_{BLINE}$ stored in the cells 100[1,1] to 100[m,n] in the period from the times t1 to t2 and the signals $V_{CONTEXT}[1]$ to $V_{CONTEXT}[m]$.

First, in the period from the times t1 to t2, the reset signal $V_{INIT}$ is set high, so that the potential $V_{RESET}$ is supplied from the reset circuit 300 to the wiring OUT.

The enable signal $V_{EN}$ is set low, so that the outputs of the enable buffers 210[1] to 210[n] have high impedance.

By setting the signals $V_{WLINE}[1]$ to $V_{WLINE}[m]$ and the signals $V_{CONTEXT}[1]$ to $V_{CONTEXT}[m]$ high sequentially from the first row, the cells 100[1,1] to 100[m,n] are selected row by row. The cells 100 in the (i−1)th row to the (i+1)th row are described as an example. First, the signal $V_{WLINE}[i−1]$ and the signal $V_{CONTEXT}[i−1]$ are set high, so that the cells 100[i−1,1]

to 100[$i-1,n$] are selected. After that, the signal $V_{WLINE}$[$i-1$] and the signal $V_{CONTEXT}$[$i-1$] are set low and the signal $V_{WLINE}$[$i$] and the signal $V_{CONTEXT}$[$i$] are set high, so that the cells 100[$i,1$] to 100[$i,n$] are selected. Then, the signal $V_{WLINE}$[$i$] and the signal $V_{CONTEXT}$[$i$] are set low and the signal $V_{WLINE}$[$i+1$] and the signal $V_{CONTEXT}$[$i+1$] are set high, so that the cells 100[$i+1,1$] to 100[$i+1,n$] are selected.

Note that the signals $V_{WLINE}$[1] to $V_{WLINE}$[m] and the signals $V_{CONTEXT}$[1] to $V_{CONTEXT}$[m] may be set high in a given order.

Note that among the signals $V_{WLINE}$[1] to $V_{WLINE}$[m] and the signals $V_{CONTEXT}$[1] to $V_{CONTEXT}$[m], only signals for rows in which rewriting of the configuration data $V_{BLINE}$ is needed may be set high.

In the cells 100 in the selected row, the configuration data $V_{BLINE}$[1] to $V_{BLINE}$[n] are stored, and the conduction or non-conduction between the wirings IN[1] to IN[n] and the wiring OUT is controlled in accordance with the stored configuration data $V_{BLINE}$[1] to $V_{BLINE}$[n]. The cell 100 in the j-th column in the case of selecting the i-th row is described as an example. In the cell 100[$i,j$], the configuration data $V_{BLINE}$[j] is stored and the conduction or non-conduction between the wiring IN[j] and the wiring OUT is controlled in accordance with the stored configuration data $V_{BLINE}$[j]. When the configuration data $V_{BLINE}$[j] stored in the cell 100[$i,j$] is high, the wiring IN[j] and the wiring OUT are brought into conduction. In that case, the potential $V_{RESET}$ is supplied to the wiring IN[j] through the cell 100[$i,j$]; thus, the potential of the wiring IN[j] is set low. On the other hand, when the configuration data $V_{BLINE}$[j] stored in the cell 100[$i,j$] is low, the wiring IN[j] and the wiring OUT are brought out of conduction. In that case, the potential $V_{RESET}$ is not supplied to the wiring IN[j], so that the wiring IN[j] becomes floating. Thus, when the wiring IN[j] is pulled up to a high level, the potential of the wiring IN[j] is set high.

The signals $V_{COMP}$[1] to $V_{COMP}$[n] output from the read circuits 400[1] to 400[n] to the wirings COMP[1] to COMP[n] are determined in accordance with the potentials of the wirings IN[1] to IN[n] and the configuration data $V_{BLINE}$[1] to $V_{BLINE}$[n] input to the wirings BLINE[1] to BLINE[n]. The cell 100 in the j-th column in the case of selecting the i-th row is described as an example. When the configuration data $V_{BLINE}$ input to the wiring BLINE[j] and the configuration data $V_{BLINE}$ stored in the cell 100[$i,j$] are both high, the potential of the wiring IN[j] is set low. Thus, the signal $V_{COMP}$[j] output from the read circuit 400[j] to the wiring COMP[j] is set high. On the other hand, when the configuration data $V_{BLINE}$ input to the wiring BLINE[j] and the configuration data $V_{BLINE}$ stored in the cell 100[$i,j$] are both low, the potential of the wiring IN[j] is set high. Thus, the signal $V_{COMP}$[j] output from the read circuit 400[j] to the wiring COMP[j] is set high.

Here, when the signals $V_{COMP}$[1] to $V_{COMP}$[n] are high, it indicates that the configuration data $V_{BLINE}$[1] to $V_{BLINE}$[n] are stored in the cells 100 in the selected row correctly. The cell 100 in the j-th column in the case of selecting the i-th row is described as an example. When the signal $V_{COMP}$[j] is high, it indicates that the configuration data $V_{BLINE}$[j] is stored in the cell 100[$i,j$] correctly.

Note that in the case where the ANDs of the signals $V_{COMP}$[1] to $V_{COMP}$[n] are output, if outputs of the ANDs are high, it indicates that the configuration data $V_{BLINE}$ is stored in all the cells 100 in the selected row correctly. On the other hand, if the outputs of the ANDs are low, it indicates that the configuration data $V_{BLINE}$ is not stored in at least one of the cells 100 in the selected row correctly.

Next, after the time t3, the reset signal $V_{INIT}$ is set low; thus, the potential $V_{RESET}$ is not supplied to the wiring OUT.

When the enable signal $V_{EN}$ is set high, the output signals of the logic elements 200[1] to 200[n] are output from the enable buffers 210[1] to 210[n] to the wirings IN[1] to IN[n], respectively. The enable buffer 210 in the j-th column is described as an example. The output signal of the logic element 200[j] is output from the enable buffer 210[j] to the wiring IN[j].

The signals $V_{WLINE}$[1] to $V_{WLINE}$[m] are set low; thus, the configuration data $V_{BLINE}$ is not stored in the cells 100[1,1] to 100[$m,n$]. Note that the configuration data $V_{BLINE}$ stored in the period from the times t1 to t2 is retained in the cells 100[1,1] to 100[$m,n$]. The cell 100 in the i-th row and the j-th column is described as an example. The configuration data $V_{BLINE}$[j] stored in the period from the times t1 to t2 is retained in the cell 100[$i,j$].

When any one of the signals $V_{CONTEXT}$[1] to $V_{CONTEXT}$[m] is set high, the cells 100[1,1] to 100[$m,n$] in any one of the rows are selected. The cells 100 in the i-th row are described as an example. The signal $V_{CONTEXT}$[i] is set high, so that the cells 100[$i,1$] to 100[$i,n$] are selected.

Note that the order of setting the signals $V_{CONTEXT}$[1] to $V_{CONTEXT}$[m] high may be set as appropriate depending on a circuit constructed by the PLD.

In the cells 100 in the selected row, the conduction or non-conduction between the wirings IN[1] to IN[n] and the wiring OUT is controlled in accordance with the configuration data $V_{BLINE}$ stored in the period from the times t1 to t2. The cell 100 in the j-th column in the case of selecting the i-th row is described as an example. In the cell 100[$i,j$], the conduction or non-conduction between the wiring IN[j] and the wiring OUT is controlled in accordance with the configuration data $V_{BLINE}$[j] stored in the period from the times t1 to t2. When the configuration data $V_{BLINE}$[j] stored in the cell 100[$i,j$] is high, the wiring IN[j] and the wiring OUT are brought into conduction. In that case, the signal output from the logic element 200[j] to the wiring IN[j] is output to the wiring OUT through the cell 100[$i,j$]. On the other hand, when the configuration data $V_{BLINE}$[j] stored in the cell 100[$i,j$] is low, the wiring IN[j] and the wiring OUT are brought out of conduction. In that case, the signal output from the logic element 200[j] to the wiring IN[j] is not output to the wiring OUT.

As described above, the connection between the wirings IN[1] to IN[n] and the wiring OUT can be set in accordance with the configuration data $V_{BLINE}$ stored in the cells 100[1,1] to 100[$m,n$]. In particular, the connection between the wirings IN[1] to IN[n] and the wiring OUT can be set in m different ways by the signals $V_{CONTEXT}$[1] to $V_{CONTEXT}$[m]. Further, whether the configuration data $V_{BLINE}$ is stored in the cells 100[1,1] to 100[$m,n$] correctly when it is stored in the cells 100[1,1] to 100[$m,n$] can be checked easily. Thus, reliability can be improved.

Note that while the PLD operates, another configuration data $V_{BLINE}$ may be stored in the cell 100 to change the connection between the wirings IN[1] to IN[n] and the wiring OUT. In other words, while the PLD operates, the circuit constructed by the PLD may be changed. The operation of the PLD in the case of storing another configuration data $V_{BLINE}$ in the cell 100 in the period from the times tc to td after the time t3 is described below.

In the period from the times tc to td, the reset signal $V_{INIT}$ is set high, so that the potential $V_{RESET}$ is supplied from the reset circuit 300 to the wiring OUT.

The enable signal $V_{EN}$ is set low, so that the outputs of the enable buffers 210[1] to 210[n] have high impedance.

By setting any one of the signals $V_{WLINE}[1]$ to $V_{WLINE}[m]$ and any one of the signals $V_{CONTEXT}[1]$ to $V_{CONTEXT}[m]$ high, the cells 100 in any one of the rows are selected. The cells 100 in the i-th row are described as an example. The signal $V_{WLINE}[i]$ and the signal $V_{CONTEXT}[i]$ are set high, so that the cells $100[i,1]$ to $100[i,n]$ are selected.

In the cells 100 in the selected row, the configuration data $V_{BLINE}[1]$ to $V_{BLINE}[n]$ are stored, and the conduction or non-conduction between the wirings IN[1] to IN[n] and the wiring OUT is controlled in accordance with the stored configuration data $V_{BLINE}[1]$ to $V_{BLINE}[n]$. The cell 100 in the j-th column in the case of selecting the i-th row is described as an example. In the cell $100[i,j]$, the configuration data $V_{BLINE}[j]$ is stored and the conduction or non-conduction between the wiring IN[j] and the wiring OUT is controlled in accordance with the stored configuration data $V_{BLINE}[j]$. When the configuration data $V_{BLINE}[j]$ stored in the cell $100[i,j]$ is high, the wiring IN[j] and the wiring OUT are brought into conduction. In that case, the potential $V_{RESET}$ is supplied to the wiring IN[j] through the cell $100[i,j]$; thus, the potential of the wiring IN[j] is set low. On the other hand, when the configuration data $V_{BLINE}[j]$ stored in the cell $100[i,j]$ is low, the wiring IN[j] and the wiring OUT are brought out of conduction. In that case, the potential $V_{RESET}$ is not supplied to the wiring IN[j], so that the wiring IN[j] becomes floating. Thus, when the wiring IN[j] is pulled up to a high level, the potential of the wiring IN[j] is set high.

The signals $V_{COMP}[1]$ to $V_{COMP}[n]$ output from the read circuits 400[1] to 400[n] to the wirings COMP[1] to COMP[n] are determined in accordance with the potentials of the wirings IN[1] to IN[n] and the configuration data $V_{BLINE}[1]$ to $V_{BLINE}[n]$ input to the wirings BLINE[1] to BLINE[n]. The cell 100 in the j-th column in the case of selecting the i-th row is described as an example. When the configuration data $V_{BLINE}$ input to the wiring BLINE[j] and the configuration data $V_{BLINE}$ stored in the cell $100[i,j]$ are both high, the potential of the wiring IN[j] is set low. Thus, the signal $V_{COMP}[j]$ output from the read circuit 400[j] to the wiring COMP[j] is set high. On the other hand, when the configuration data $V_{BLINE}$ input to the wiring BLINE[j] and the configuration data $V_{BLINE}$ stored in the cell $100[i,j]$ are both low, the potential of the wiring IN[j] is set high. Thus, the signal $V_{COMP}[j]$ output from the read circuit 400[j] to the wiring COMP[j] is set high.

As described above, even while the PLD operates, another configuration data $V_{BLINE}$ can be stored in the cell 100, and whether the configuration data $V_{BLINE}$ is stored in the cell 100 correctly can be checked easily.

This embodiment can be combined with any of the other embodiments as appropriate.

Embodiment 3

In this embodiment, an oxide semiconductor that can be used for a semiconductor layer of a transistor is described.

An oxide semiconductor used for a channel formation region in the semiconductor layer of the transistor preferably contains at least indium (In) or zinc (Zn). In particular, In and Zn are preferably contained. A stabilizer for strongly bonding oxygen is preferably contained in addition to In and Zn. As a stabilizer, at least one of gallium (Ga), tin (Sn), zirconium (Zr), hafnium (Hf), and aluminum (Al) may be contained. As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor used for the semiconductor layer of the transistor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide with an atomic ratio of In:Ga:Zn=1:1:1, In:Ga:Zn=3:1:2, or In:Ga:Zn=2:1:3, or an oxide whose composition is in the neighborhood of the above composition is preferably used.

When an oxide semiconductor film included in the semiconductor layer contains a large amount of hydrogen, hydrogen and the oxide semiconductor are bonded to each other, so that part of hydrogen serves as a donor and causes an electron (carrier). As a result, the threshold voltage of the transistor is shifted in a negative direction. Thus, it is preferable that after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is reduced by the dehydration treatment (dehydrogenation treatment) in some cases. Thus, it is preferable that oxygen be added to the oxide semiconductor film to fill oxygen vacancies increased by the dehydration treatment (dehydrogenation treatment). In this specification and the like, supplying oxygen to an oxide semiconductor film is expressed as oxygen adding treatment, and treatment for making the oxygen content of an oxide semiconductor film be in excess of that in the stoichiometric composition is expressed as treatment for making an oxygen-excess state in some cases.

In this manner, hydrogen or moisture is removed from the oxide semiconductor film by dehydration treatment (dehydrogenation treatment) and oxygen vacancies are filled by oxygen adding treatment, so that the oxide semiconductor film can be an intrinsic (i-type) or substantially intrinsic oxide semiconductor film. Note that the substantially intrinsic oxide semiconductor film means an oxide semiconductor film that contains extremely few (close to zero) carriers derived from a donor and has a carrier density of lower than or equal to $1\times10^{17}/cm^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$.

In this manner, the transistor including an intrinsic (i-type) or substantially intrinsic i-type oxide semiconductor film can have extremely favorable off-state current characteristics. For example, the drain current at the time when the transistor including an oxide semiconductor film is off can be less than or equal to $1 \times 10^{-18}$ A, preferably less than or equal to $1 \times 10^{-21}$ A, and more preferably $1 \times 10^{-24}$ A at room temperature (approximately 25° C.); or less than or equal to $1 \times 10^{-15}$ A, preferably $1 \times 10^{-18}$ A, more preferably less than or equal to $1 \times 10^{-21}$ A at 85° C. The off state of a transistor refers to a state where gate voltage is much lower than the threshold voltage in an n-channel transistor. Specifically, when the gate voltage is lower than the threshold voltage by 1 V or more, 2 V or more, or 3 V or more, the transistor is off.

The structure of the oxide semiconductor film is described below.

An oxide semiconductor film is roughly classified into a single-crystal oxide semiconductor film and a non-single-crystal oxide semiconductor film. The non-single-crystal oxide semiconductor film means any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example of the amorphous oxide semiconductor film is an oxide semiconductor film in which no crystal part exists even in a microscopic region, and the whole of the film is amorphous.

The microcrystalline oxide semiconductor film includes a microcrystal (also referred to as nanocrystal) of greater than or equal to 1 nm and less than 10 nm, for example. Thus, the microcrystalline oxide semiconductor film has higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit into a cube whose one side is less than 100 nm. Thus, there is a case where a crystal part included in the CAAC-OS film fits into a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (planar TEM image), metal atoms are arranged in a triangular or hexagonal configuration in the crystal parts. However, there is no regularity of arrangement of metal atoms between different crystal parts.

From the results of the cross-sectional TEM image and the planar TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (ϕ scan) is performed under conditions where the sample is rotated around a normal vector of a sample surface as an axis (ϕ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when ϕ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer which is arranged in a layered manner and observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

Further, the crystallinity in the CAAC-OS film is not necessarily uniform. For example, in the case where crystal growth leading to the CAAC-OS film occurs from the vicinity of the top surface of the film, the crystallinity in the vicinity of the top surface is higher than that in the vicinity of the formation surface in some cases. Further, when an impurity is added to the CAAC-OS film, the crystallinity in a region to which the impurity is added is changed, and the crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor including the CAAC-OS film, changes in electrical characteristics of the transistor due to irradiation with visible light or ultraviolet light are small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

In this specification, the term "parallel" indicates that an angle formed between two straight lines is −10 to 100, and accordingly includes the case where the angle is −5 to 5°. In addition, the term "perpendicular" indicates that an angle formed between two straight lines is 80 to 100°, and accordingly includes the case where the angle is 85 to 95°.

In this specification, the trigonal and rhombohedral crystal systems are included in the hexagonal crystal system.

The state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus can have low carrier density in some cases. Thus, in some cases, a transistor including the oxide semiconductor in a channel formation region rarely has negative threshold voltage (is rarely normally on). A highly purified intrinsic or substantially highly purified intrinsic oxide semiconductor has low density of defect states and accordingly has low density of trap states in some cases. Thus, the transistor including the oxide semiconductor in the channel formation region has a small variation in electrical characteristics and high reliability in some cases. Note that electric charge trapped by the trap states in the oxide semiconductor takes a long time to disappear. The trapped electric charge may behave like fixed electric charge. Thus, the transistor that includes the oxide semiconductor having high density of trap states in the channel formation region has unstable electrical characteristics in some cases.

A transistor including the highly purified intrinsic or substantially highly purified intrinsic CAAC-OS has a small variation in electrical characteristics due to irradiation with visible light or ultraviolet light.

An oxide semiconductor may include polycrystal, for example. Note that an oxide semiconductor including polycrystal is referred to as a polycrystalline oxide semiconductor. A polycrystalline oxide semiconductor includes a plurality of crystal grains.

An oxide semiconductor may include microcrystal, for example. Note that an oxide semiconductor including microcrystal is referred to as a microcrystalline oxide semiconductor.

In an image obtained with a TEM, for example, crystal parts cannot be found clearly in the microcrystalline oxide semiconductor in some cases. In most cases, the size of a crystal part included in the microcrystalline oxide semiconductor is greater than or equal to 1 nm and less than or equal to 100 nm, or greater than or equal to 1 nm and less than or equal to 10 nm. Microcrystal with a size greater than or equal to 1 nm and less than or equal to 10 nm is specifically referred to as nanocrystal (nc), for example. An oxide semiconductor including nanocrystal is referred to as a nanocrystalline oxide semiconductor (nc-OS). In an image of the nc-OS obtained with a TEM, for example, a boundary between crystal parts is not clearly detected in some cases. In an image of the nc-OS obtained with a TEM, for example, since a clear grain boundary does not exist, for example, segregation of an impurity is unlikely to occur. In the nc-OS, since a clear grain boundary does not exist, for example, high density of defect states is unlikely to occur. In the nc-OS, since a clear grain boundary does not exist, for example, a reduction in electron mobility is unlikely to occur.

In the nc-OS, for example, a microscopic region (e.g., a region with a size greater than or equal to 1 nm and less than or equal to 10 nm) has periodic atomic order occasionally. Further, for example, in the nc-OS, crystal parts are not regularly arranged. Thus, there is a case where periodic atomic order is not observed macroscopically or a case where long-range order in atomic arrangement is not observed. Accordingly, in some cases, the nc-OS cannot be distinguished from an amorphous oxide semiconductor, for example, depending on an analysis method. When the nc-OS is analyzed by an out-of-plane method with an XRD apparatus using an X-ray having a beam diameter larger than the diameter of a crystal part, a peak which shows alignment does not appear in some cases. Further, for example, a halo pattern is shown in some cases in an electron diffraction pattern of the nc-OS obtained by using an electron beam having a beam diameter larger than the diameter of a crystal part (e.g., a beam diameter of 20 nm$\phi$ or more, or 50 nm$\phi$ or more). For example, spots are shown in some cases in a nanobeam electron diffraction pattern of the nc-OS obtained by using an electron beam having a beam diameter smaller than or equal to the diameter of a crystal part (e.g., a beam diameter of 10 nm$\phi$ or less, or 5 nm$\phi$ or less). In a nanobeam electron diffraction pattern of the nc-OS, for example, regions with high luminance in a circular pattern are shown in some cases. In a nanobeam electron diffraction pattern of the nc-OS, for example, a plurality of spots are shown in the region in some cases.

Since the microscopic region in the nc-OS has periodic atomic order occasionally, the nc-OS has lower density of defect states than the amorphous oxide semiconductor. Note that since crystal parts in the nc-OS are not regularly arranged, the nc-OS has higher density of defect states than the CAAC-OS.

Note that the oxide semiconductor may be a mixed film including two or more of a CAAC-OS, a polycrystalline oxide semiconductor, a microcrystalline oxide semiconductor, and an amorphous oxide semiconductor. The mixed film includes two or more of an amorphous oxide semiconductor region, a microcrystalline oxide semiconductor region, a polycrystalline oxide semiconductor region, and a CAAC-OS region in some cases. The mixed film has a layered structure of two or more of an amorphous oxide semiconductor region, a microcrystalline oxide semiconductor region, a polycrystalline oxide semiconductor region, and a CAAC-OS region in some cases.

This embodiment can be combined with any of the other embodiments as appropriate.

Embodiment 4

In this embodiment, examples of transistors and a capacitor that can be used in a semiconductor device or a PLD according to one embodiment of the present invention are described.

Figure 11:
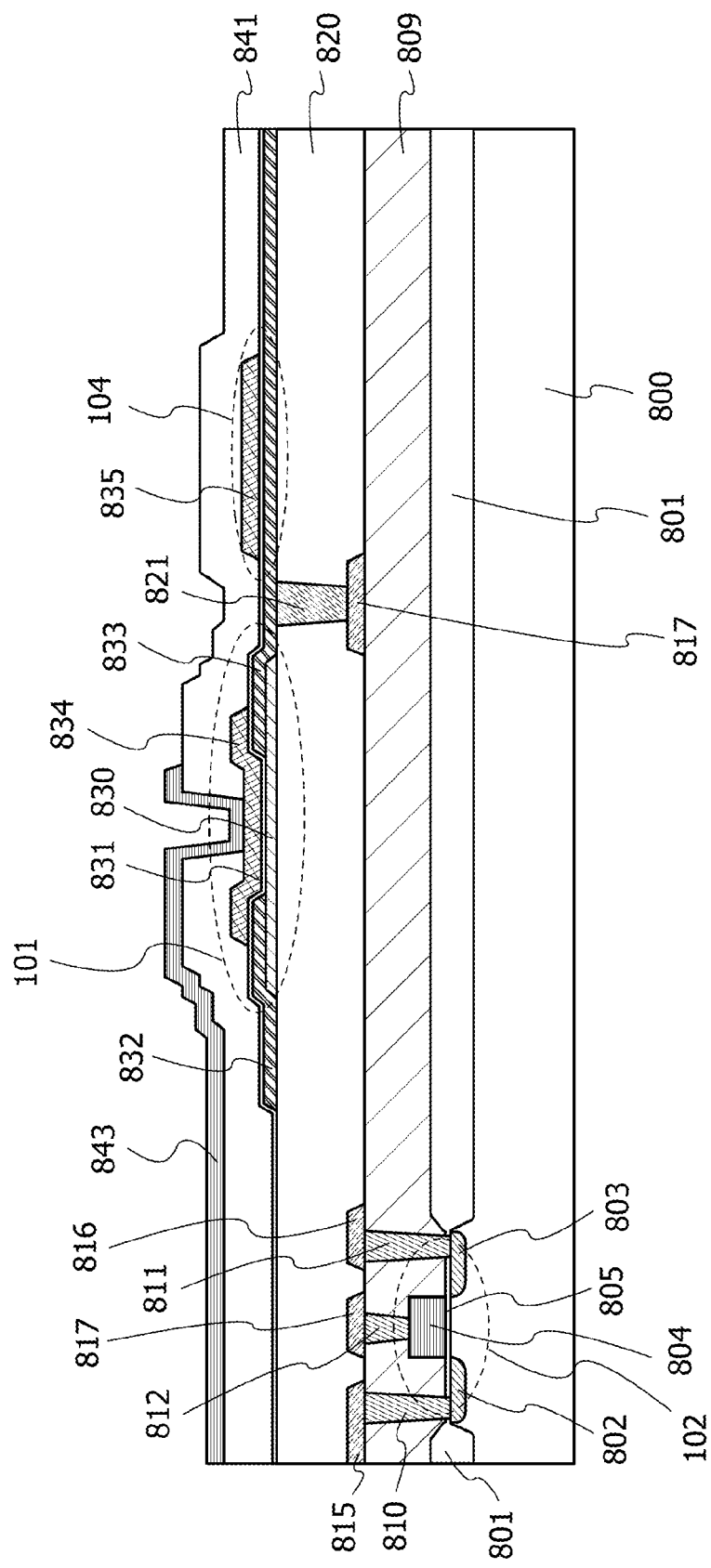
FIG. 11 is a cross-sectional view illustrating a transistor or capacitor cross-sectional structure.

FIG. 11 illustrates cross-sectional structures of the transistors 101 and 102 and the capacitor 104 described in Embodiments 1 and 2.

The transistor 101 is formed over the transistor 102. In other words, the transistor 101 and the transistor 102 are stacked. Thus, high integration can be achieved.

An oxide semiconductor can be used for a semiconductor layer of the transistor 101.

The transistor 102 is formed using a single crystal silicon substrate. Note that a thin film of silicon, germanium, or the like may be used for a semiconductor layer of the transistor 102. Silicon or germanium is amorphous, microcrystalline, polycrystalline, or single crystal. For a silicon thin film, any of the following can be used: amorphous silicon formed by sputtering or vapor phase growth such as plasma-enhanced CVD; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

In FIG. 11, the n-channel transistor 102 is formed in a semiconductor substrate 800.

The semiconductor substrate 800 can be, for example, an n-type or p-type silicon substrate, germanium substrate, silicon germanium substrate, or compound semiconductor substrate (e.g., GaAs substrate, InP substrate, GaN substrate, SiC substrate, GaP substrate, GaInAsP substrate, or ZnSe substrate). In FIG. 11, a single crystal silicon substrate having n-type conductivity is used.

The transistor 102 is electrically isolated from another transistor by an element isolation insulating film 801. The element isolation insulating film 801 can be formed by a local oxidation of silicon (LOCOS) method, a trench isolation method, or the like. Specifically, the transistor 102 includes impurity regions 802 and 803 that are formed in the semiconductor substrate 800 and function as a source region and a drain region, a gate electrode 804, and a gate insulating film 805 provided between the semiconductor substrate 800 and the gate electrode 804. The gate electrode 804 overlaps with a channel formation region formed between the impurity regions 802 and 803 with the gate insulating film 805 positioned between the gate electrode 804 and the channel formation region.

An insulating film 809 is provided over the transistor 102. Openings are formed in the insulating film 809. Wirings 810 and 811 that are in contact with the impurity regions 802 and 803, respectively, and a wiring 812 that is in contact with the gate electrode 804 is formed in the openings.

The wiring 810 is connected to a wiring 815 formed over the insulating film 809. The wiring 811 is connected to a wiring 816 formed over the insulating film 809. The wiring 812 is connected to a wiring 817 formed over the insulating film 809.

An insulating film 820 is formed over the wirings 815 to 817. An opening is formed in the insulating film 820. In the opening, a wiring 821 that is connected to the wiring 817 is formed.

The transistor 101 and the capacitor 104 are formed over the insulating film 820.

The transistor 101 includes, over the insulating film 820, a semiconductor film 830 containing an oxide semiconductor, conductive films 832 and 833 that are positioned over the semiconductor film 830 and function as a source electrode and a drain electrode, a gate insulating film 831 over the semiconductor film 830 and the conductive films 832 and 833, and a gate electrode 834 that is positioned over the gate insulating film 831 and overlaps with the semiconductor film 830 between the conductive films 832 and 833. Note that the conductive film 833 is connected to the wiring 821.

A conductive film 835 is provided over the gate insulating film 831 to overlap with the conductive film 833. A portion where the conductive films 833 and 835 overlap with each other with the gate insulating film 831 positioned therebetween functions as the capacitor 104.

Note that in FIG. 11, the capacitor 104 is provided over the insulating film 820 together with the transistor 101. However, the capacitor 104 may be provided below the insulating film 820 together with the transistor 102.

An insulating film 841 is provided over the transistor 101 and the capacitor 104. An opening is provided in the insulating film 841. Over the insulating film 841, a conductive film 843 that is in contact with the gate electrode 834 through the opening is provided.

Note that in FIG. 11, the transistor 101 includes the gate electrode 834 on at least one side of the semiconductor film 830. Alternatively, the transistor 101 may include a pair of gate electrodes with the semiconductor film 830 positioned therebetween.

When the transistor 101 includes a pair of gate electrodes with the semiconductor film 830 positioned therebetween, a signal for controlling an on state or an off state may be supplied to one of the gate electrodes, and the other of the gate electrodes may be supplied with a potential from another element. In the latter case, potentials at the same level may be supplied to the pair of electrodes, or a fixed potential such as a ground potential may be supplied only to the other of the gate electrodes. By controlling the level of a potential applied to the other of the gate electrodes, the threshold voltage of the transistor 101 can be controlled.

Figure 12A:
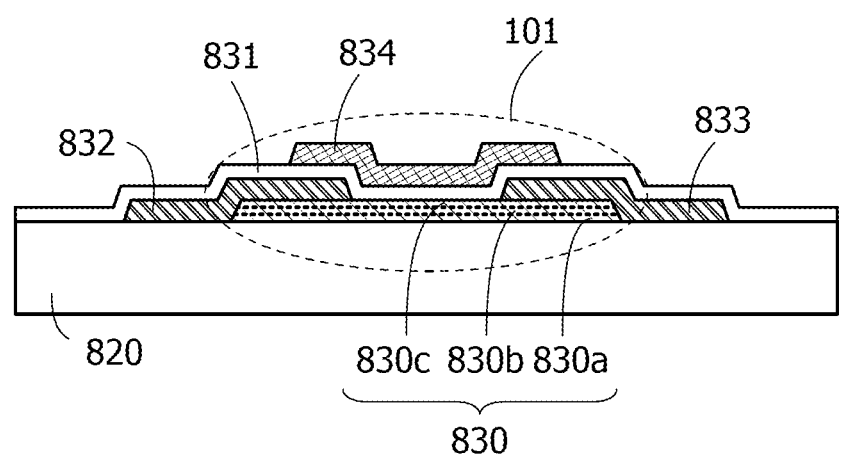
FIGS. 12A and 12B are cross-sectional views each illustrating a transistor or capacitor cross-sectional structure.

The semiconductor film 830 is not necessarily formed using a single oxide semiconductor film, and may be formed using a stack of a plurality of oxide semiconductor layers. For example, FIG. 12A illustrates a structure example of the transistor 101 in which the semiconductor film 830 has a three-layer structure. The transistor 101 includes the semiconductor film 830 provided over the insulating film 820 and the like, the conductive films 832 and 833 electrically connected to the semiconductor film 830, the gate insulating film 831, and the gate electrode 834 that is provided over the gate insulating film 831 to overlap with the semiconductor film 830. Oxide semiconductor layers 830a to 830c are stacked sequentially from the insulating film 820 side as the semiconductor film 830. Each of the oxide semiconductor layers 830a and 830c is an oxide layer that contains at least one of metal elements contained in the oxide semiconductor layer 830b and in which energy at the bottom of the conduction band is closer to the vacuum level than that in the oxide semiconductor layer 830b by higher than or equal to 0.05 eV, 0.07 eV, 0.1 eV, or 0.15 eV and lower than or equal to 2 eV, 1 eV, 0.5 eV, or 0.4 eV. The oxide semiconductor layer 830b preferably contains at least indium because carrier mobility is increased.

Figure 12B:
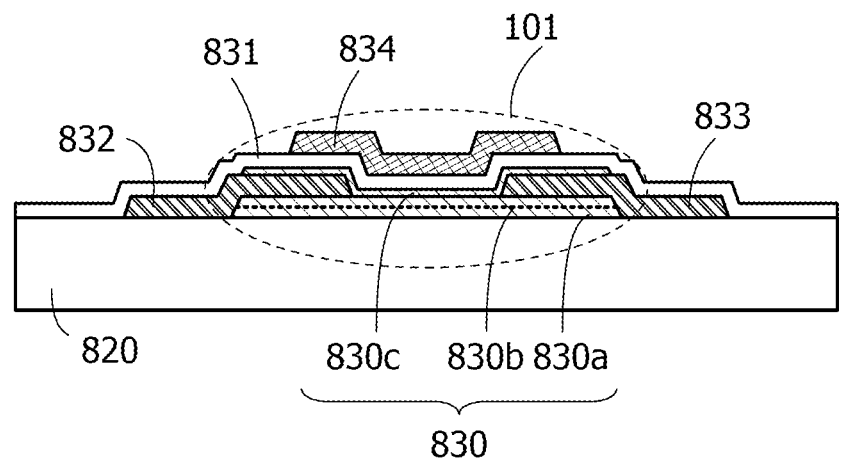

Note that as illustrated in FIG. 12B, the oxide semiconductor layer 830c may be provided over the conductive films 832 and 833 to overlap with the gate insulating film 831.

This embodiment can be combined with any of the other embodiments as appropriate.

Embodiment 5

In this embodiment, examples in which a circuit including the transistor described in the above embodiment is used in an electronic component and examples in which the circuit including the transistor described in the above embodiment is used in an electronic device including the electronic component are described with reference to FIGS. 13A and 13B and FIGS. 14A to 14E.

Figure 13A:
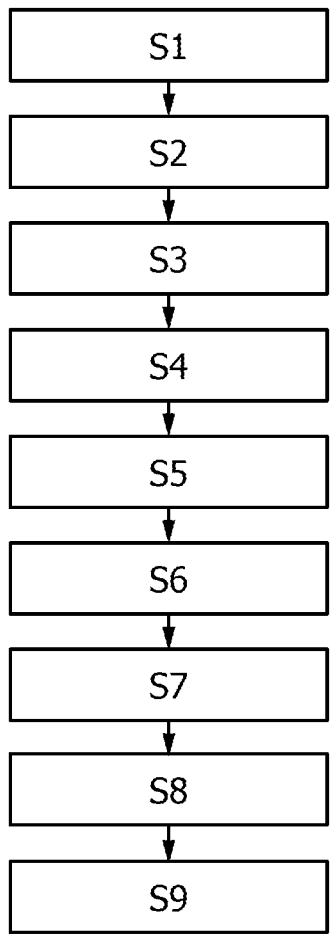
FIGS. 13A and 13B illustrate electronic components.

FIG. 13A illustrates an example in which the circuit including the transistor described in the above embodiment is used in an electronic component. Note that the electronic component is also referred to as a semiconductor package or an IC package. This electronic component has a plurality of standards and names depending on a terminal extraction direction and a terminal shape. Thus, examples of the electronic component are described in this embodiment.

A semiconductor device including a transistor as illustrated in FIG. 11 is completed after an assembly process (post-process) by using a plurality of components that can be detached and attached from and to a printed wiring board in combination.

The post-process can be finished through each step in FIG. 13A. Specifically, after an element substrate obtained in the preceding process is completed (Step S1), a rear surface of the substrate is ground (Step S2). By thinning the substrate at this stage, the warpage or the like of the substrate in the preceding process is reduced and the component is downsized.

The rear surface of the substrate is ground so that the substrate is divided into a plurality of chips in a dicing process. Then, the divided chips are separately picked up to be mounted on and bonded to a lead frame in a die bonding process (Step S3). In this die bonding process, the chip is bonded to the lead frame by an appropriate method depending on a product, for example, bonding with a resin or a tape. Note that in the die bonding process, bonding between the chip and the lead frame may be conducted by mounting the chip on an interposer.

Then, wire bonding is performed to electrically connect lead of the lead frame to an electrode on the chip with a metal fine line (wire) (Step S4). A silver line or a gold line can be used as the metal fine line. Ball bonding or wedge bonding can be used as the wire bonding.

A molding process is performed to seal the wire bonded chip with an epoxy resin or the like (Step S5). With the molding process, the electronic component is filled with the resin, so that a mounted circuit portion or wire can be protected against mechanical external force. Further, deterioration in characteristics due to moisture or dust can be reduced.

Next, plate processing is performed on the lead of the lead frame. After that, the lead is cut and processed (Step S6). This plate processing prevents rust of the lead and facilitates soldering at the time of mounting the chip on a printed wiring board in a later step.

Then, printing (marking) is performed on a surface of the package (Step S7). Through the final inspection process (Step S8), the electronic component having the circuit portion including a PLD is completed (Step S9).

The above electronic component can include a semiconductor device, a PLD, or the like according to one embodiment of the present invention. Thus, it is possible to obtain a highly reliable electronic component.

Figure 13B:
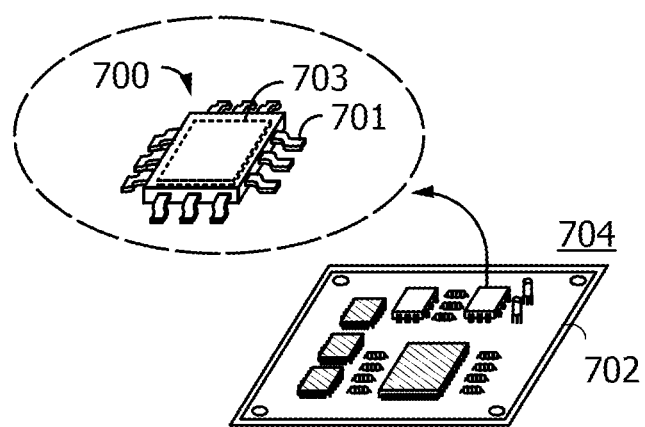

FIG. 13B is a schematic perspective view of the completed electronic component. FIG. 13B illustrates a schematic perspective view of a quad flat package (QFP) as an example of the electronic component. A lead 701 and a semiconductor device 703 of an electronic component 700 are illustrated in FIG. 13B. The electronic component 700 in FIG. 13B is mounted on a printed wiring board 702, for example. When the plurality of electronic components 700 are used in combination and electrically connected to each other over the printed wiring board 702, a board on which the electronic components are mounted (a mounted board 704) is completed. The completed mounted board 704 is provided in an electronic device or the like.

Then, applications of the electronic component to an electronic device such as a computer, a portable information terminal (including a cellular phone, a portable game machine, an audio reproducing device, and the like), electronic paper, a television device (also referred to as a television or a television receiver), or a digital video camera are described.

Figure 14A:
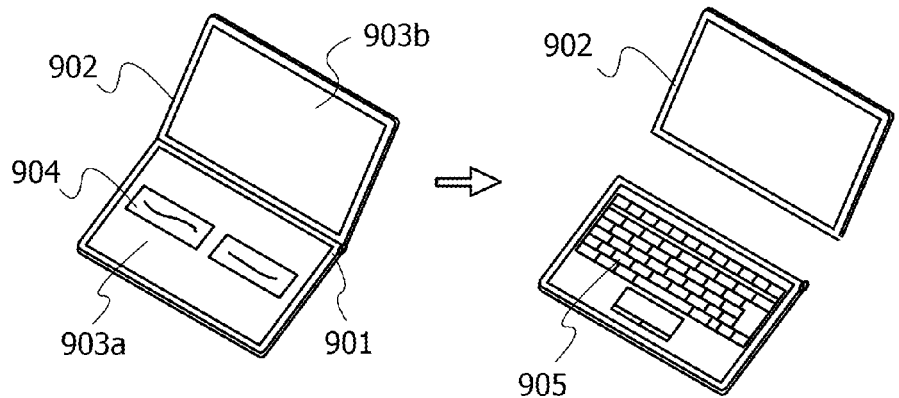
FIGS. 14A to 14E illustrate electronic devices.

FIG. 14A illustrates a portable information terminal, which includes a housing 901, a housing 902, a first display portion 903a, a second display portion 903b, and the like. The mounted board including the semiconductor device or the PLD according to one embodiment of the present invention is provided in at least part of the housing 901 or 902. Thus, a small, light-weight, or low-power portable information terminal is obtained.

Note that the first display portion 903a is a touch panel, and for example, as illustrated in the left of FIG. 14A, which of "touch input" and "keyboard input" is performed can be selected by a selection button 904 displayed on the first display portion 903a. Since the selection buttons with a variety of sizes can be displayed, the portable information terminal can be used easily by people of any generation. In the case where "keyboard input" is selected, for example, a keyboard 905 is displayed on the first display portion 903a as illustrated in the right of FIG. 14A. With the keyboard 905, letters can be input rapidly by keyboard input as in the case of using a conventional information terminal, for example.

Further, one of the first display portion 903a and the second display portion 903b can be detached from the portable information terminal as illustrated in the right in FIG. 14A. The first display portion 903a can also function as a touch panel for a reduction in weight to carry around to be operated by one hand while the other hand supports the housing 902, which is convenient.

The portable information terminal in FIG. 14A can have a function of displaying various kinds of information (e.g., a still image, a moving image, and a text image), a function of displaying a calendar, a date, the time, or the like on the display portion, a function of operating or editing the information displayed on the display portion, a function of controlling processing by various kinds of software (programs), and the like. Further, an external connection terminal (e.g., an earphone terminal or a USB terminal), a recording medium insertion portion, and the like may be provided on the back surface or the side surface of the housing.

The portable information terminal in FIG. 14A may transmit and receive data wirelessly. Through wireless communication, desired book data or the like can be purchased and downloaded from an electronic book server.

Further, the housing 902 in FIG. 14A may have an antenna, a microphone function, or a wireless communication function to be used as a cellular phone.

Figure 14B:
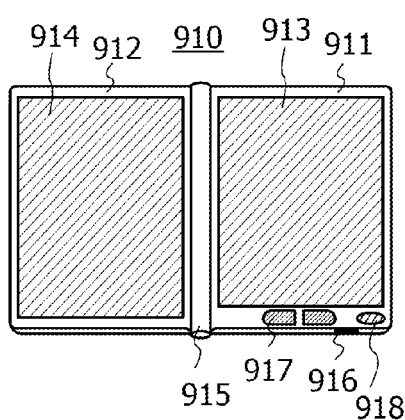

FIG. 14B illustrates an e-book reader 910 including electronic paper. The e-book reader 910 includes two housings 911 and 912. The housing 911 and the housing 912 include a display portion 913 and a display portion 914, respectively. The housings 911 and 912 are connected to each other by a hinge 915, so that the e-book reader 910 can be opened and closed using the hinge 915 as an axis. The housing 911 includes a power button 916, operation keys 917, a speaker 918, and the like. The mounted board including the semiconductor device or the PLD according to one embodiment of the present invention is provided in at least one of the housings 911 and 912. Thus, a small, light-weight, or low-power e-book reader is obtained.

Figure 14C:
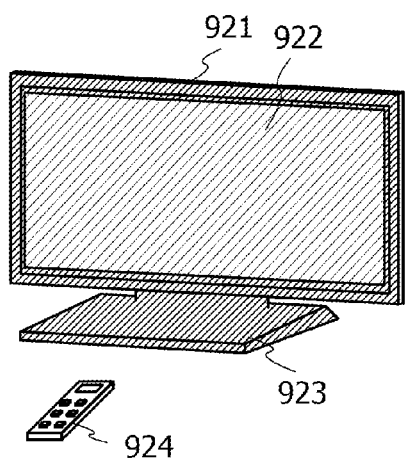

FIG. 14C illustrates a television device, which includes a housing 921, a display portion 922, a stand 923, and the like. The television device 920 can be operated with a switch of the housing 921 and a remote control 924. The mounted board including the semiconductor device or the PLD according to one embodiment of the present invention is mounted on the housing 921 and the remote control 924. Thus, a small, light-weight, or low-power television device is obtained.

Figure 14D:
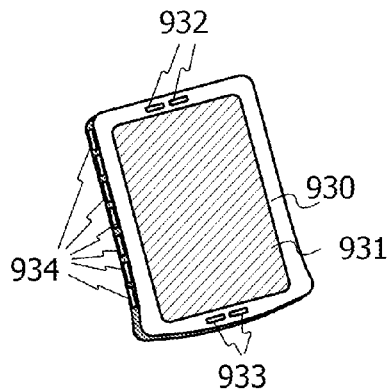

FIG. 14D illustrates a smartphone in which a main body 930 includes a display portion 931, a speaker 932, a microphone 933, operation buttons 934, and the like. The mounted board including the semiconductor device or the PLD according to one embodiment of the present invention is provided in the main body 930. Thus, a small, light-weight, or low-power smartphone is obtained.

Figure 14E:
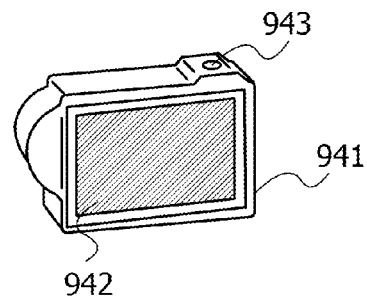

FIG. 14E illustrates a digital camera, which includes a main body 941, a display portion 942, an operation switch 943, and the like. The mounted board including the semiconductor device or the PLD according to one embodiment of the present invention is provided in the main body 941. Thus, a small, light-weight, or low-power digital camera is obtained.

As described above, the mounted board including the semiconductor device or the PLD according to one embodiment of the present invention is mounted on the electronic device described in this embodiment. Thus, a highly reliable electronic device is obtained.

This application is based on Japanese Patent Application serial No. 2013-048616 filed with Japan Patent Office on Mar. 12, 2013, the entire contents of which are hereby incorporated by reference.

What is claimed is:

1. A programmable logic device comprising:
a switch comprising an input terminal and an output terminal;
a first logic element comprising an output terminal;
a second logic element comprising an input terminal;
a read circuit; and
a bit line,
wherein the output terminal of the first logic element is electrically connected to the input terminal of the switch,
wherein the output terminal of the switch is electrically connected to the input terminal of the second logic element,
wherein the bit line is configured to supply configuration data to the switch,
wherein the switch is configured to control conduction between the input terminal of the switch and the output terminal of the switch in accordance with first data stored in the switch,
wherein the read circuit is configured to compare the configuration data and second data, and
wherein the second data is supplied from the input terminal of the switch and corresponds to the first data.

2. The programmable logic device according to claim 1,
wherein the configuration data is first configuration data,
wherein the first logic element comprises a first configuration memory configured to store second configuration data,
wherein a function of the first logic element is changed in accordance with the second configuration data,
wherein the second logic element comprises a second configuration memory configured to store third configuration data, and
wherein a function of the second logic element is changed in accordance with the third configuration data.

3. The programmable logic device according to claim 1, further comprising a reset circuit,
wherein the reset circuit is configured to supply a reset voltage to the output terminal of the switch when the second data is supplied from the input terminal of the switch.

4. The programmable logic device according to claim 1, further comprising a pull-up circuit,
wherein the pull-up circuit is configured to supply a voltage to the input terminal of the switch when the second data is supplied from the input terminal of the switch.

5. The programmable logic device according to claim 1, further comprising an enable buffer,
wherein the enable buffer is configured not to output an output signal of the first logic element to the input terminal of the switch when the second data is supplied from the input terminal of the switch.

6. The programmable logic device according to claim 1, further comprising a reset circuit, a pull-up circuit, and an enable buffer,
wherein the reset circuit is configured to supply a reset voltage to the output terminal of the switch when the second data is supplied from the input terminal of the switch,
wherein the pull-up circuit is configured to supply a voltage to the input terminal of the switch when the second data is supplied from the input terminal of the switch, and
wherein the enable buffer is configured not to output an output signal of the first logic element to the input terminal of the switch when the second data is supplied from the input terminal of the switch.

7. A programmable logic device comprising:
a switch comprising a first transistor, a second transistor, an input terminal, and an output terminal;
a first logic element comprising an output terminal;
a second logic element comprising an input terminal;
a read circuit; and
a bit line,
wherein a first terminal of the first transistor is electrically connected to the bit line,
wherein a second terminal of the first transistor is electrically connected to a gate of the second transistor,
wherein a first terminal of the second transistor is electrically connected to the input terminal of the switch,
wherein a second terminal of the second transistor is electrically connected to the output terminal of the switch,
wherein the output terminal of the first logic element is electrically connected to the input terminal of the switch,
wherein the output terminal of the switch is electrically connected to the input terminal of the second logic element,
wherein the bit line is configured to supply configuration data to the switch,
wherein the switch is configured to control conduction between the input terminal of the switch and the output terminal of the switch in accordance with first data stored in the switch,
wherein the read circuit is configured to compare the configuration data and second data, and
wherein the second data is supplied from the input terminal of the switch and corresponds to the first data.

8. The programmable logic device according to claim 7,
wherein the first transistor comprises a channel formation region comprising an oxide semiconductor.

9. The programmable logic device according to claim 8,
wherein the oxide semiconductor of the channel formation region of the first transistor comprises In, Ga, and Zn.

10. The programmable logic device according to claim 7,
wherein the configuration data is first configuration data,
wherein the first logic element comprises a first configuration memory configured to store second configuration data,
wherein a function of the first logic element is changed in accordance with the second configuration data,
wherein the second logic element comprises a second configuration memory configured to store third configuration data, and
wherein a function of the second logic element is changed in accordance with the third configuration data.

11. The programmable logic device according to claim 7, further comprising a reset circuit,
wherein the reset circuit is configured to supply a reset voltage to the output terminal of the switch when the second data is supplied from the input terminal of the switch.

12. The programmable logic device according to claim 7, further comprising a pull-up circuit,
wherein the pull-up circuit is configured to supply a voltage to the input terminal of the switch when the second data is supplied from the input terminal of the switch.

13. The programmable logic device according to claim 7, further comprising an enable buffer,
wherein the enable buffer is configured not to output an output signal of the first logic element to the input terminal of the switch when the second data is supplied from the input terminal of the switch.

14. The programmable logic device according to claim 7, further comprising a reset circuit, a pull-up circuit, and an enable buffer,
wherein the reset circuit is configured to supply a reset voltage to the output terminal of the switch when the second data is supplied from the input terminal of the switch,
wherein the pull-up circuit is configured to supply a voltage to the input terminal of the switch when the second data is supplied from the input terminal of the switch, and
wherein the enable buffer is configured not to output an output signal of the first logic element to the input terminal of the switch when the second data is supplied from the input terminal of the switch.

15. A programmable logic device comprising:
a switch comprising a first transistor, a second transistor, a first inverter circuit, a second inverter circuit, an input terminal, and an output terminal;
a first logic element comprising an output terminal;
a second logic element comprising an input terminal;
a read circuit; and
a bit line,
wherein a first terminal of the first transistor is electrically connected to the bit line,
wherein a second terminal of the first transistor is electrically connected to a gate of the second transistor,
wherein a first terminal of the second transistor is electrically connected to the input terminal of the switch,
wherein a second terminal of the second transistor is electrically connected to the output terminal of the switch,
wherein an input terminal of the first inverter circuit is electrically connected to the gate of the second transistor and an output terminal of the second inverter circuit,
wherein an output terminal of the first inverter circuit is electrically connected to an input terminal of the second inverter circuit,
wherein the output terminal of the first logic element is electrically connected to the input terminal of the switch,
wherein the output terminal of the switch is electrically connected to the input terminal of the second logic element,
wherein the bit line is configured to supply configuration data to the switch,
wherein the switch is configured to control conduction between the input terminal of the switch and the output terminal of the switch in accordance with first data stored in the switch,
wherein the read circuit is configured to compare the configuration data and second data, and
wherein the second data is supplied from the input terminal of the switch and corresponds to the first data.

16. The programmable logic device according to claim 15,
wherein the configuration data is first configuration data,
wherein the first logic element comprises a first configuration memory configured to store second configuration data,
wherein a function of the first logic element is changed in accordance with the second configuration data,
wherein the second logic element comprises a second configuration memory configured to store third configuration data, and
wherein a function of the second logic element is changed in accordance with the third configuration data.

17. The programmable logic device according to claim 15, further comprising a reset circuit,
wherein the reset circuit is configured to supply a reset voltage to the output terminal of the switch when the second data is supplied from the input terminal of the switch.

18. The programmable logic device according to claim 15, further comprising a pull-up circuit,
wherein the pull-up circuit is configured to supply a voltage to the input terminal of the switch when the second data is supplied from the input terminal of the switch.

19. The programmable logic device according to claim 15, further comprising an enable buffer,
wherein the enable buffer is configured not to output an output signal of the first logic element to the input terminal of the switch when the second data is supplied from the input terminal of the switch.

20. The programmable logic device according to claim 15, further comprising a reset circuit, a pull-up circuit, and an enable buffer,
wherein the reset circuit is configured to supply a reset voltage to the output terminal of the switch when the second data is supplied from the input terminal of the switch,
wherein the pull-up circuit is configured to supply a voltage to the input terminal of the switch when the second data is supplied from the input terminal of the switch, and
wherein the enable buffer is configured not to output an output signal of the first logic element to the input terminal of the switch when the second data is supplied from the input terminal of the switch.

* * * * *